(12) United States Patent
Shen et al.

(10) Patent No.: US 10,867,891 B2
(45) Date of Patent: Dec. 15, 2020

(54) ION THROUGH-SUBSTRATE VIA

(71) Applicant: Taiwan Semiconductor Manufacturing Co., Ltd., Hsin-Chu (TW)

(72) Inventors: Yu-Yang Shen, Kaohsiung (TW); Chien-Hsien Tseng, Hsinchu (TW); Dun-Nian Yaung, Taipei (TW); Nai-Wen Cheng, Tainan (TW); Pao-Tung Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/391,550

(22) Filed: Apr. 23, 2019

(65) Prior Publication Data
US 2020/0135617 A1 Apr. 30, 2020

Related U.S. Application Data

(60) Provisional application No. 62/749,752, filed on Oct. 24, 2018.

(51) Int. Cl.
| | |
|---|---|
| *H01L 23/48* | (2006.01) |
| *H01L 23/522* | (2006.01) |
| *H01L 23/532* | (2006.01) |
| *H01L 21/265* | (2006.01) |
| *H01L 25/18* | (2006.01) |

(52) U.S. Cl.
CPC .......... *H01L 23/481* (2013.01); *H01L 21/265* (2013.01); *H01L 23/5226* (2013.01); *H01L 23/53214* (2013.01); *H01L 23/53228* (2013.01); *H01L 25/18* (2013.01)

(58) Field of Classification Search
CPC . H01L 23/481; H01L 25/18; H01L 23/53228; H01L 21/265; H01L 23/5226; H01L 23/53214
USPC ........................................................ 257/774
See application file for complete search history.

(56) References Cited

U.S. PATENT DOCUMENTS

| | | |
|---|---|---|
| 2013/0285130 A1 | 10/2013 | Ting et al. |
| 2014/0239362 A1 | 8/2014 | Koo et al. |
| 2016/0211306 A1 | 7/2016 | Choi et al. |

(Continued)

*Primary Examiner* — Karen Kusumakar
*Assistant Examiner* — Adam S Bowen
(74) *Attorney, Agent, or Firm* — Eschweiler & Potashnik, LLC

(57) ABSTRACT

Various embodiments of the present disclosure are directed towards an integrated circuit (IC) including a first through substrate via (TSV) within a first semiconductor substrate. The first semiconductor substrate has a front-side surface and a back-side surface respectively on opposite sides of the first semiconductor substrate. The first semiconductor substrate includes a first doped channel region extending from the front-side surface to the back-side surface. The first through substrate via (TSV) is defined at least by the first doped channel region. A first interconnect structure on the front-side surface of the first semiconductor substrate. The first interconnect structure includes a plurality of first conductive wires and a plurality of first conductive vias, and the first conductive wires and the first conductive vias define a conductive path to the first TSV.

20 Claims, 12 Drawing Sheets

(56) References Cited

U.S. PATENT DOCUMENTS

2017/0110420 A1\* 4/2017 Cheng ................... H01L 21/84
2017/0194273 A1\* 7/2017 Chen ...................... H01L 24/92

\* cited by examiner

ION THROUGH-SUBSTRATE VIA

REFERENCE TO RELATED APPLICATION

This application claims the benefit of U.S. Provisional Application No. 62/749,752, filed on Oct. 24, 2018, the contents of which are incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs. Commonly, through-substrate vias (TSVs) are used to electrically couple stacked 2D ICs together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
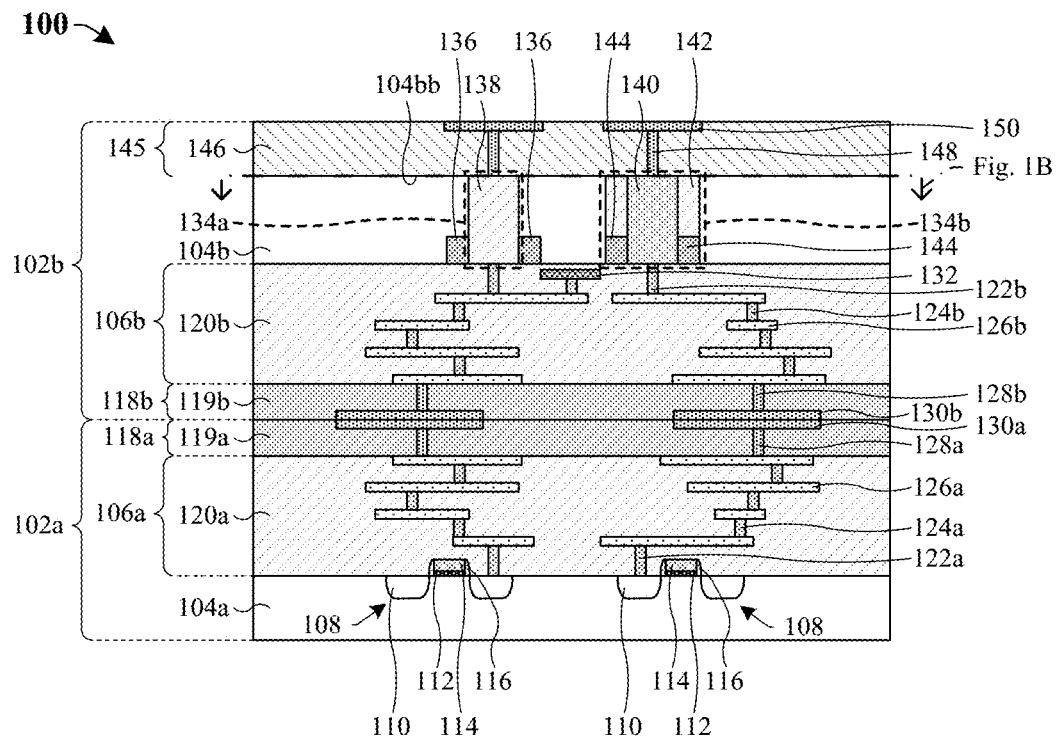
FIG. 1A illustrates a cross-sectional view of some embodiments of a three-dimensional (3D) integrated circuit (IC) comprising a first IC die and a second IC die that respectively comprise first semiconductor devices and ion through-substrate vias (TSVs).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of three-dimensional (3D) integrated circuit (IC) comprises a first IC die and a second IC die over the first IC die. The first and second IC dies are two-dimensional (2D) IC dies, and comprise respective semiconductor substrates, respective interconnect structures, and respective bonding structures. The interconnect structures are between the semiconductor substrates, and the bonding structures are between the interconnect structures. The interconnect structures comprise alternating stacks of wiring layers (e.g., horizontal routing) and via layers (e.g., vertical routing). The bonding structures comprise respective bonding dielectric layers and respective bonding contacts. The bonding dielectric layers contact at a bonding interface between the first and second IC dies, and the bonding contacts contact at the bonding interface.

The 3D IC further comprises a plurality of metal (e.g., copper or aluminum) through-substrate vias (TSVs) extending through a semiconductor substrate of the second IC die, from a back-side of the second IC die to a front-side of the second IC die. The interconnect structure of the second IC is on the front-side of the second IC die, and one or more electrodes is/are disposed directly over the 3D IC on the back-side of the second IC die. The electrode(s) electrically couple correspondingly with the metal TSVs, and the metal TSVs electrically couple to wiring layers in the interconnect structure of the second IC die. A challenge is that the metal TSVs may cause a mechanical stress to neighboring semiconductor devices (e.g., transistors, photodetectors, etc.). This mechanical stress may, in turn, cause failure (e.g., a short circuit) of the semiconductor devices. Therefore, a "keep-out-zone" may be established in the 3D IC to indicate a minimum lateral distance between the semiconductor devices and the metal TSVs. Semiconductor devices are disposed within a center device region of the 3D IC, and the metal TSVs are disposed in a peripheral region of the 3D IC that surrounds the center device region and is laterally separated from the center device region by the keep-out-zone. A challenge with the keep-out-zone is that a large amount of the 3D IC is devoted to the keep-out-zone, thereby limiting scaling down of the 3D IC and contributing to design and modeling complexity.

It has been appreciated that the above structure and/or material of the metal TSVs may present a number of practical difficulties. For example, widths of the metal TSVs and/or spacing of the metal TSVs may be too large (e.g., respectively greater than approximately 0.5 micrometers and 0.4 micrometers) and may limit the number of metal TSVs that may be disposed within the 3D IC. Further, reducing widths of the metal TSVs and/or spacing of the metal TSVs may be limited by the capabilities of tools used to form the metal TSVs. As another example, formation of the metal TSVs may be complex. For example, forming the metal TSVs may comprise: patterning a substrate to form an opening extending through an entire thickness of the substrate; depositing a dielectric layer covering the substrate and lining the opening; etching back the dielectric to localize the dielectric layer to sidewalls of the opening; depositing a conductive layer filling the opening and covering the substrate; and performing a planarization into the conductive layer until the substrate. Further, reducing the complexity for forming the metal TSVs may be impeded by the material (i.e., metal) of the metal TSVs.

Various embodiments of the present application are directed towards ion TSVs and/or a method for forming the ion TSVs. In some embodiments, an ion TSV is formed by forming a masking layer over a semiconductor substrate and implanting dopants (e.g., N-type and/or P-type) into the semiconductor substrate. The ion TSV extends and provides electrical coupling from a front-side surface of the semiconductor substrate to an opposing back-side surface of the semiconductor substrate. Ion TSVs mitigate mechanical stress to overlying, underlying, and/or adjacent semiconductor devices (e.g., transistors, photodetectors, etc.). This, in turn, removes the "keep-out-zone" in a 3D IC, such that at least some ion TSVs may, for example, directly underlie and/or overlie the semiconductor devices. Further, the aforementioned method may, for example, form ion TSVs: 1) with small lengths and/or small width (e.g., length and width may each be approximately between 0.3-0.5 micrometers); 2) with small spacing (e.g., spacing may be between approximately 0.2-0.4 micrometers); 3) at reduced complexity; or 4) or any combination of the foregoing.

FIG. 1A illustrates a cross-sectional view of some embodiments of a three-dimensional (3D) integrated circuit (IC) 100 having a first IC die 102a underlying a second IC die 102b.

In some embodiments, the first and second IC dies 102a, 102b may comprise respective semiconductor substrates 104a, 104b. The semiconductor substrates 104a, 104b are spaced from one another, respectively under and over respective interconnect structures 106a, 106b. In some embodiments, the semiconductor substrates 104a, 104b may, for example, be bulk substrates of monocrystalline silicon or some other semiconductor, some other type of semiconductor substrate, or a combination of the foregoing.

In some embodiments, a plurality of semiconductor devices 108 is laterally spaced over a first semiconductor substrate 104a of the first IC die 102a. The semiconductor devices 108 may, for example, be metal-oxide-semiconductor field-effect transistor (MOSFETs), some other metal-oxide-semiconductor (MOS) devices, some other insulated-gate field-effect transistors (IGFETs), some other semiconductor devices, or any combination of the foregoing. In some embodiments, the semiconductor devices 108 are configured as transistors and comprise corresponding source/drain regions 110, corresponding gate dielectric layer 112, corresponding gate electrode 114, and corresponding sidewall spacers 116.

The interconnect structures 106a, 106b of the first and second IC dies 102a, 102b are between the semiconductor substrates 104a, 104b and are spaced from one another by bonding structures 118a, 118b (e.g., hybrid bonding layers). A first interconnect structure 106a of the first IC die 102a comprises a first interconnect dielectric structure 120a, first conductive contacts 122a, first conductive vias 124a, and first conductive wires 126a. Similarly, a second interconnect structure 106b of the second IC die 102b comprises a second interconnect dielectric structure 120b, second conductive contacts 122b, second conductive vias 124b, second conductive wires 126b, and a channel control contact 132. In some embodiments, the channel control contact 132 is configured to provide control of a conductive channel within a complementary metal-oxide-semiconductor (CMOS) device (such as adjacent transistors (not shown)). In some embodiments, the first and second interconnect dielectric structures 120a, 120b may comprise a plurality of dielectric layers, respectively. In further embodiments, the first and second interconnect dielectric structures 120a, 120b may, for example, be or comprise silicon dioxide, a low κ dielectric, some other dielectric, or a combination of the foregoing. As used herein, a low κ dielectric is a dielectric with a dielectric constant κ less than about 3.9. The first conductive wires 126a are alternatingly stacked with the first conductive vias 124a in the first interconnect dielectric structure 120a. The second conductive wires 126b are alternatingly stacked with the second conductive vias 124b in the second interconnect dielectric structure 120b.

The bonding structures 118a, 118b of the first and second IC dies 102a, 102b are between the first and second interconnect structures 106a, 106b. In some embodiments, a first bonding structure 118a is bonded to a second bonding structure 118b by way of a hybrid bond, or some other suitable bond. The first bonding structure 118a comprises a first bonding dielectric structure 119a, first redistribution vias 128a, and first redistribution wires 130a. Similarly, the second bonding structure 118b comprises a second bonding dielectric structure 119b, second redistribution vias 128b, and second redistribution wires 130b. First redistribution vias 128a and first redistribution wires 130a are disposed within the first bonding dielectric structure 119a. Second redistribution vias 128b and second redistribution wires 130b are disposed within the second bonding dielectric structure 119b. The first and second redistribution vias 128a, 128b and the first and second redistribution wires 130a, 130b facilitate electrical coupling between the first interconnect structure 106a and the second interconnect structure 106b.

A second semiconductor substrate 104b overlies the second interconnect structure 106b. The second semiconductor substrate 104b comprises a first doping type (e.g., P-type). A first through-substrate via (TSV) 134a and a second TSV 134b overlie the second conductive contacts 122b and are electrically coupled to the semiconductor devices 108 by way of the first and second interconnect structures 106a, 106b. In some embodiments, the first TSV 134a comprises a first doped channel region 138 surrounded by a first isolation structure 136. In some embodiments, outer sidewalls of the first doped channel region 138 adjoin inner sidewalls of the first isolation structure 136. In further embodiments, the first doped channel region 138 is a doped region of the second semiconductor substrate 104b comprising a second doping type (e.g., N-type) opposite the first doping type (e.g., P-type). Therefore, in some embodiments, the first TSV 134a may, for example, comprise a semiconductor substrate material (e.g., silicon).

In some embodiments, the second TSV 134b comprises a second doped channel region 140 surrounded by a third doped channel region 142. Outer sidewalls of the second doped channel region 140 adjoin the inner sidewalls of the second isolation structure 144. In some embodiments, the second doped channel region 140 comprises the first doping type (e.g., P-type) and the third doped channel region 142 comprises the second doping type (e.g., N-type). In further embodiments, the second and third doped channel regions 140, 142 are respectively doped regions of the second semiconductor substrate 104b. Therefore, in some embodiments, the second TSV 134b may, for example, comprise the semiconductor substrate material (e.g., silicon).

A first back-side bonding structure 145 overlies a back-side 104bb of the second semiconductor substrate 104b. The first back-side bonding structure 145 comprises a first back-side bonding dielectric structure 146, first back-side redistribution vias 148, and first back-side redistribution wires 150. First back-side redistribution vias 148 and first back-side redistribution wires 150 are within the first back-side bonding dielectric structure 146 and directly overlie the first and second TSVs 134a, 134b.

In some embodiments, a depletion region forms at outer regions of the first TSV 134a (e.g., due to p-n junctions between the first doped channel region 138 and a doped region of the second semiconductor substrate 104b that surrounds the first TSV 134a). In further embodiments, a depletion region forms at outer regions of the second TSV 134b (e.g., due to p-n junctions between the third doped channel region 142 and a doped region of the second semiconductor substrate 104b that surrounds the second TSV 134b) and a depletion region forms at an interface between the second and third doped channel regions 140, 142 (e.g., due to p-n junctions between the second and third doped channel regions 140, 142). The first and second TSVs 134a, 134b provide electrically coupling between the semiconductor devices 108 and the first back-side redistribution vias and wires 148, 150 by way of the first and second interconnect structures 106a, 106b. In yet further embodiments, the formation of depletion regions at the outer regions of the first and second TSVs 134a, 134b facilitates electrical isolation between the first and second TSVs 134a, 134b and adjacent regions of the second semiconductor substrate 104b. This, in part, is because under certain operating conditions, for example, the p-n junctions may act as diodes, such that current flows from a P-type region to an N-type region (but current may not flow from the N-type region to the P-type region).

By virtue of the first and second TSVs 134a, 134b comprising doped regions of the second semiconductor substrate 104b (e.g., first, second, and third doped channel regions 138, 140, 142), the first and second TSVs 134a, 134b may be laterally spaced above the semiconductor devices 108. The semiconductor substrate material (e.g., silicon) of the first and second TSVs 134a, 134b mitigates mechanical stress induced upon the underlying semiconductor devices 108, which in turn may prevent device breakdown (e.g., due to mechanical stress) of the semiconductor devices 108. Therefore, the first and second TSVs 134a, 134b may facilitate electrical coupling between the back-side redistribution wires 150 and the semiconductor devices 108 while being laterally spaced above the semiconductor devices 108. This, in turn, may eliminate a "keep-out zone" while designing the 3D IC 100. Thus, the 3D IC 100 may be further shrunk, and the design and modeling complexity of the 3D IC 100 can be reduced.

The first and second conductive contacts 122a, 122b, the first and second conductive vias 124a, 124b, the first and second conductive wires 126a, 126b, the first and second redistribution vias 128a, 128b, the first and second redistribution wires 130a, 130b, and the first back-side redistribution vias and wires 148, 150 are conductive and may, for example, be or comprise aluminum copper, aluminum, copper, tungsten, some other metal or conductive material, a combination of the foregoing, or the like. In some embodiments, the channel control contact 132 may, for example, be a conductive material comprising doped polysilicon and/or metal. In some embodiments, the first and second interconnect structures 106a, 106b comprise a conductive material different than a material the first and second TSVs 134a, 134b are comprised of. In some embodiments, the first and second isolation structures 136, 144 may, for example, be or comprise a dielectric material (e.g., silicon dioxide), a shallow trench isolation (STI) structure, a deep trench isolation (DTI) structure, or some other suitable isolation structure. The first and second bonding dielectric structures 119a, 119b and the first back-side bonding dielectric structure 146 may, for example, be or comprise silicon dioxide, another dielectric, or a combination of the foregoing.

In some embodiments, the second semiconductor substrate 104b comprises the first doping type (e.g., P-type) with a doping concentration of approximately $1*10^{15}$ atoms/cm$^3$. In some embodiments, the P-type dopants of the first doping type may, for example be or comprise boron, difluoroboron (e.g., $BF_2$), indium, some other suitable P-type dopants, or any combination of the foregoing. In some embodiments, the first and third doped channel regions 138, 142 comprise the second doping type (e.g., N-type) with a doping concentration within a range of approximately $1*10^{16}$ to $1*10^{20}$ atoms/cm$^3$. In some embodiments, the N-type dopants of the second doping type may, for example be or comprise phosphorous, arsenic, antimony, some other suitable N-type dopants, or any combination of the foregoing. In some embodiments, the second doped channel region 140 may comprise the first doping type with a doping concentration within a range of approximately $1*10^{16}$ to $1*10^{20}$ atoms/cm$^3$. In some embodiments, a doping concentration of the second doped channel region 140 is greater than a doping concentration of the second semiconductor substrate 104b.

Figure 1B:
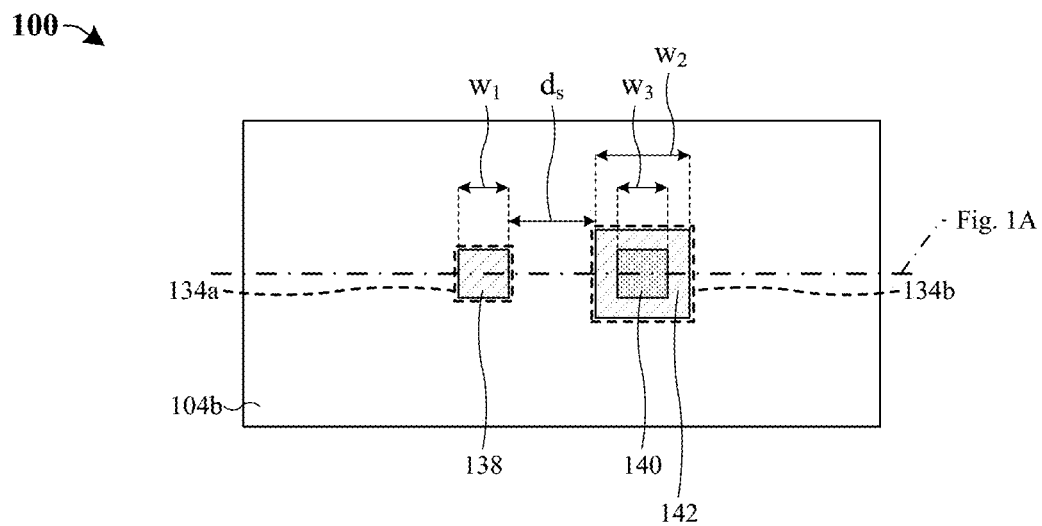
FIG. 1B illustrates a top view of some embodiments of the 3D IC of FIG. 1A according to the cut-line in FIG. 1A.

With reference to FIG. 1B, a top view of some embodiments of the 3D IC 100 of FIG. 1A according to the cut-lines in FIGS. 1A and 1B is provided.

As illustrated in FIG. 1B, an edge of the first TSV 134a is laterally spaced from an edge of the second TSV 134b by a first lateral distance $d_s$. In some embodiments, the first lateral distance $d_s$ is within a range of approximately 0.2 to 0.4 micrometers. In some embodiments, if the first lateral distance $d_s$ is less than approximately 0.2 micrometers, then the first and second TSVs 134a, 134b may become electrically shorted together, rendering the 3D IC 100 inoperable. In further embodiments, if the first lateral distance $d_s$ is greater than approximately 0.4 micrometers, then the first lateral distance $d_s$ may mitigate the number of TSVs and/or semiconductor devices that may be formed on and/or under the second semiconductor substrate 104b.

In some embodiments, the first TSV 134a may have a first lateral width $w_1$ within a range of approximately 0.3 to 0.5 micrometers. In some embodiments, if the first lateral width $w_1$ is less than approximately 0.3 micrometers, then a conductivity of the first TSV 134a may be too low, thus reducing the performance of the 3D IC 100. In further embodiments, if the first lateral width $w_1$ is greater than approximately 0.5 micrometers, then the first TSV 134a may use too much space on the second semiconductor substrate 104b, thereby reducing the number of TSVs and/or semiconductor devices that may be formed on and/or under the second semiconductor substrate 104b.

In some embodiments, the second TSV 134b may have a second lateral width $w_2$ within a range of approximately 0.3 to 0.5 micrometers. In some embodiments, if the second lateral width $w_2$ is less than approximately 0.3 micrometers, then a conductivity of the second TSV 134b may be too low, thus reducing the performance of the 3D IC 100. In further embodiments, if the second lateral width $w_2$ is greater than approximately 0.5 micrometers, then the second TSV 134b may use too much space on the second semiconductor substrate 104b, thereby reducing the number of TSVs and/or semiconductor devices that may be formed on and/or under the second semiconductor substrate 104b. In yet further embodiments, the second doped channel region 140 may have a third lateral width $w_3$ within a range of approximately 0.1 to 0.3 micrometers. In some embodiments, the second lateral width $w_2$ of the second TSV 134b is greater than the first lateral width $w_1$ of the first TSV 134a, or vice versa. In further embodiments, the first and second lateral widths $w_1$, $w_2$ are approximately equal (not shown).

In some embodiment, the semiconductor substrate material (e.g., silicon) of the first and second TSVs 134a, 134b reduces a width and spacing (i.e., the first lateral distance $d_s$, the first lateral width $w_1$, and the second lateral width $w_2$) of the first and second TSVs 134a, 134b. This, in part, is because tools (e.g., tools used to perform a doping process) used to form the first and second TSVs 134a, 134b facilitate the reduction of the width and spacing (i.e., the first lateral distance $d_s$, the first lateral width $w_1$, and the second lateral width $w_2$) of the first and second TSVs 134a, 134b. Thus, capabilities of the tools (e.g., tools used to perform the doping process) facilitating shrinking of the 3D IC 100 and/or increasing a number of TSVs disposed on the 3D IC 100.

Figure 1C:
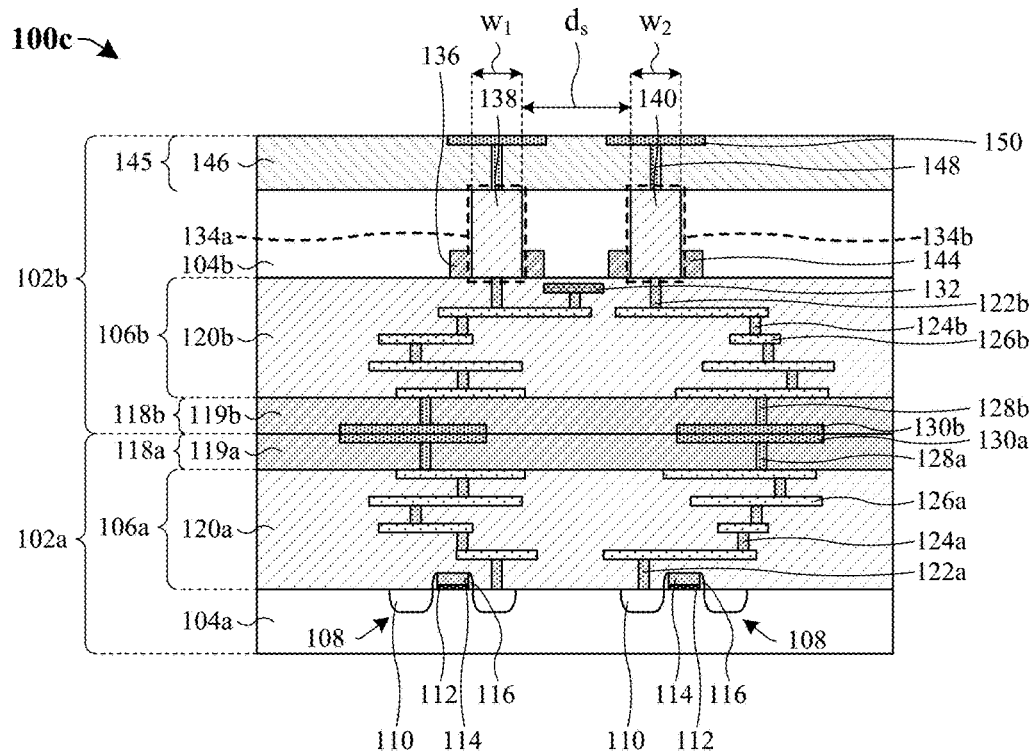
FIGS. 1C-1E illustrate cross-sectional views of various alternative embodiments of the 3D IC of FIG. 1A.

With reference to FIG. 1C, a cross-sectional view of a 3D IC 100c according to some alternative embodiments of the 3D IC 100 of FIG. 1A is provided in which the first and second TSVs 134a, 134b respectively comprise a single doped channel region.

As illustrated in FIG. 1C, the second TSV 134b comprises a second doped channel region 140 surrounded by the second isolation structure 144. In some embodiments, outer sidewalls of the second doped channel region 140 adjoin inner sidewalls of the second isolation structure 144. In further embodiments, the second doped channel region 140 is a doped region of the second semiconductor substrate 104b comprising the second doping type (e.g., N-type) opposite the first doping type (e.g., P-type). Therefore, the second TSV 134b is configured the same as the first TSV 134a. In some embodiments, the first and second doped channel regions 138, 140 comprise the second doping type with approximately the same doping concentration. In some embodiments, a first lateral width $w_1$ of the first TSV 134a is approximately equal to a second lateral $w_2$ of the second TSV 134b. In further embodiments, the second semiconductor substrate 104b comprises N-type dopants and the first and second TSVs 134a, 134b comprise P-type dopants.

Figure 1D:
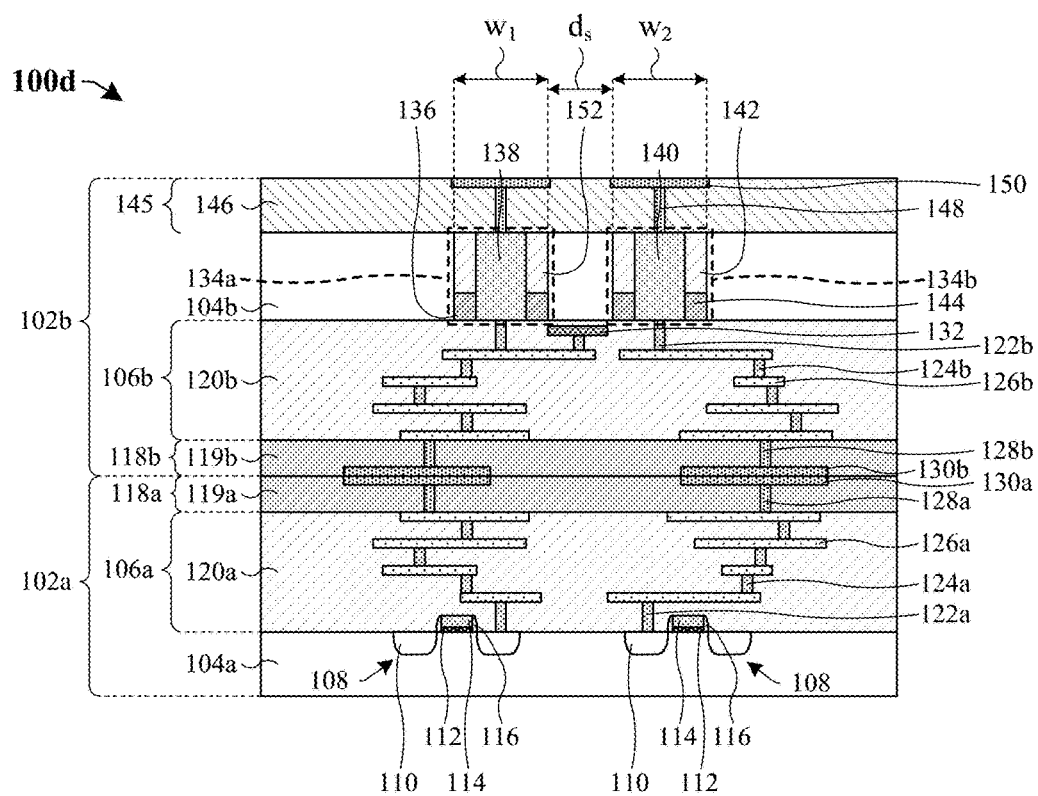

With reference to FIG. 1D, a cross-sectional view of a 3D IC 100d according to some alternative embodiments of the 3D IC 100 of FIG. 1A is provided in which the first and second TSVs 134a, 134b each comprise two doped channel regions.

As illustrated in FIG. 1D, the first TSV 134a comprises a first doped channel region 138 surrounded by a fourth doped channel region 152. Outer sidewalls and inner sidewalls of the first isolation structure 136 adjoin outer sidewalls and inner sidewalls of the fourth doped channel region 152, respectively. In some embodiments, the first doped channel region 138 comprises the first doping type (e.g., P-type) and the fourth doped channel region 152 comprises the second doping type (e.g., N-type). In further embodiments, the first and second doped channel regions 138, 140 are respectively doped regions of the second semiconductor substrate 104b. Therefore, for example, the first TSV 134a is configured the same as the second TSV 134b. In some embodiments, the first and second doped channel regions 138, 140 comprise the first doping type with approximately the same doping concentration. In further embodiments, the third and fourth doped channel regions 142, 152 comprise the second doping type with approximately the same doping concentration. In yet further embodiments, a first lateral width $w_1$ of the first TSV 134a is approximately equal to a second lateral $w_2$ of the second TSV 134b.

Figure 1E:
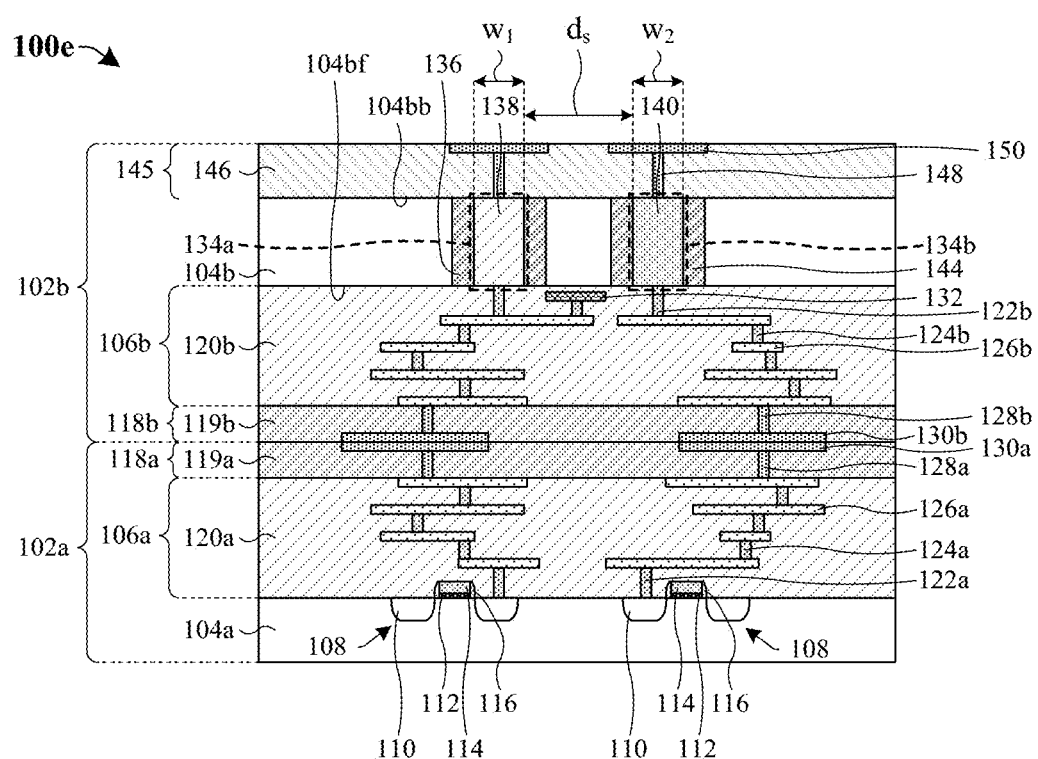

With reference to FIG. 1E, a cross-sectional view of a 3D IC 100e according to some alternative embodiments of the 3D IC 100 of FIG. 1A is provided in which the first and second TSVs 134a, 134b each comprise a single doped channel region.

As illustrated in FIG. 1E, the first and second isolation structures 136, 144 are configured as deep trench isolation (DTI) structures that extend from a front-side 104bf of the second semiconductor substrate 104b to the back-side 104bb of the second semiconductor substrate 104b. In some embodiments, the DTI structure configuration of the first and second isolation structures 136, 144 may enhance electrical isolation between the first and second TSVs 134a, 134b and any adjacent semiconductor devices (e.g., transistors) disposed on the front-side 104bf of the second semiconductor substrate 104b (not shown). This, in part, may increase a stability and performance of the 3D IC 100e, thereby further increasing an ability to shrink the 3D IC 100e. The second TSV 134b comprises a second doped channel region 140 surrounded by the second isolation structure 144. In some embodiments, outer sidewalls of the second doped channel region 140 adjoin inner sidewalls of the second isolation structure 144. In further embodiments, the second doped channel region 140 is a doped region of the second semiconductor substrate 104b comprising the first doping type (e.g., P-type). In yet further embodiments, the first and second TSVs 134a, 134b may both comprise the first doping type (e.g., P-type) or the first and second TSVs 134a, 134b may both comprise the second doping type (e.g., N-type).

Figure 2A:
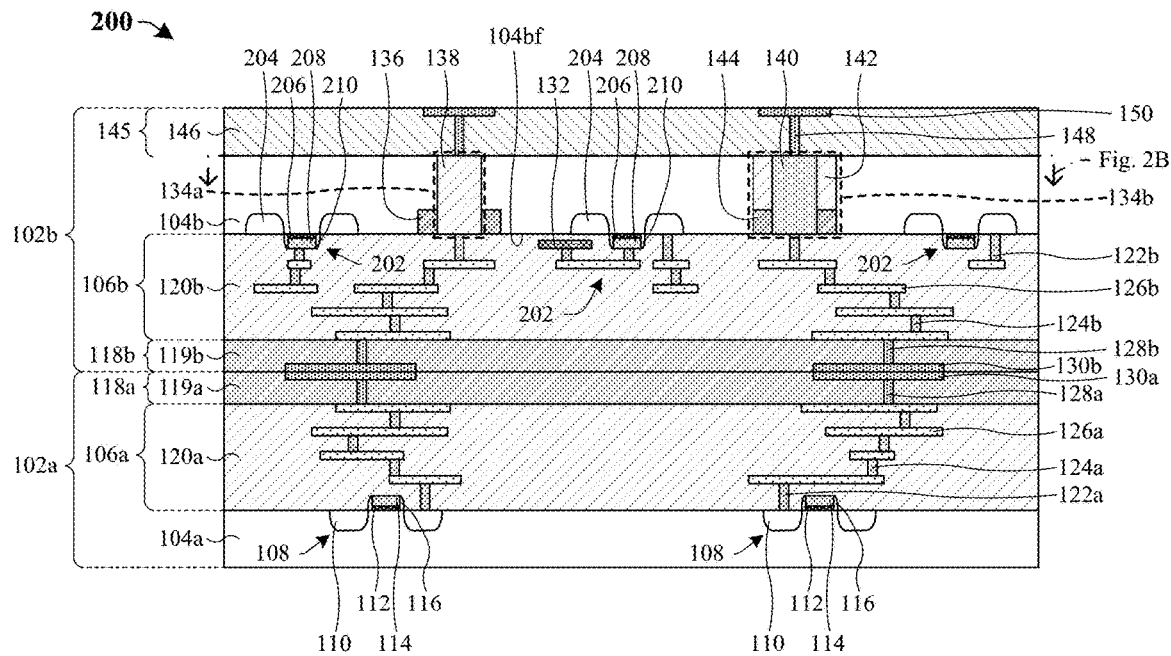
FIG. 2A illustrates a cross-sectional view of various alternative embodiments of the 3D IC of FIG. 1A in which the second IC die further comprises second semiconductor devices.

With reference to FIG. 2A, a cross-sectional view of a 3D IC 200 according to some alternative embodiments of the 3D IC 100 of FIG. 1A is provided in which a second plurality of semiconductor devices 202 underlies the second semiconductor substrate 104b.

As illustrated in FIG. 2A, the second plurality of semiconductor devices 202 is laterally adjacent to the first and second TSVs 134a, 134b. At least one semiconductor device of the second plurality of semiconductor devices 202 is disposed laterally between the first and second TSVs 134a, 134b. The second plurality of semiconductor devices 202 may, for example, be metal-oxide-semiconductor field-effect transistors (MOSFETs), some other metal-oxide-semiconductor (MOS) devices, some other insulated-gate field-effect transistors (IGFETs), some other semiconductor devices, or any combination of the foregoing. In some embodiments, the semiconductor devices 202 are configured as transistors and respectively comprise source/drain regions 204, gate dielectric 206, gate electrode 208, and sidewall spacers 210. The source/drain regions 204 are in the second semiconductor substrate 104b. The source/drain regions 204 are respectively at ends of the gate electrode 208. The source/drain regions 204 have the second doping type (e.g., N-type) and directly adjoin portions of the second semiconductor substrate 104b having the first doping type (e.g., P-type).

The gate dielectrics 206 respectively underlie the second semiconductor substrate 104b, and the gate electrodes 208 respectively underlie the gate dielectrics 206. The gate dielectrics 206 may, for example, be or comprise silicon dioxide and/or some other dielectric material, and/or the gate electrodes 208 may be or comprise, for example, doped polysilicon, metal, some other conductive material, or any combination of the foregoing. The sidewall spacers 210 may, for example, be or comprise silicon dioxide, silicon nitride, silicon oxynitride, silicon carbide, some other dielectric, or any combination of the foregoing. In some embodiments, the second plurality of semiconductor devices 202 is electrically coupled to other semiconductor devices (e.g., photodetectors) by way of the second interconnect structure 106b (not shown). In some embodiments, the channel control contact 132 is configured to apply a bias voltage to the gate electrode 208 of one of the semiconductor devices 202 to control a conductive channel within the second semiconductor substrate 104b.

In some embodiments, if the first and second TSVs 134a, 134b comprised a metal material (e.g., aluminum, copper, tungsten, etc.), then the second plurality of semiconductor devices 202 may not be disposed on the second semiconductor substrate 104b (not shown). In the aforementioned example, the metal material of the first and second TSVs 134a, 134b may cause mechanical strain to adjacent semiconductor devices (e.g., the second plurality of semiconductor devices 202), thereby rendering the adjacent semiconductor devices inoperable and/or prone to failure. Therefore, according to some embodiments of the present disclosure, the semiconductor substrate material (e.g., silicon) of the first and second TSVs 134a, 134b in FIG. 2A mitigates mechanical strain on the second plurality of semiconductor devices 202. Placing the second plurality of semiconductor devices 202 on a front-side 104bf of the second semiconductor substrate 104b may reduce an overall size of the 3D IC 200, reduce a complexity in the design and/or formation of the 3D IC 200, and/or facilitate the omission of an additional IC die (not shown) (e.g., that comprises the second plurality of semiconductor devices 202).

Although the 3D IC 200 of FIG. 2A is illustrated with the first and second TSVs 134a, 134b of FIG. 1A, it may be appreciated, for example, that the first and second TSVs 134a, 134b from FIGS. 1C-1E may be used in FIG. 2A. Additionally, any combination of the first and second TSVs 134a, 134b from FIGS. 1A-1E may be used in FIG. 2A. Further, the first and second isolation structures 136, 144 of FIG. 2A may be configured, for example, as DTI structures as illustrated and described in FIG. 1E.

Figure 2B:
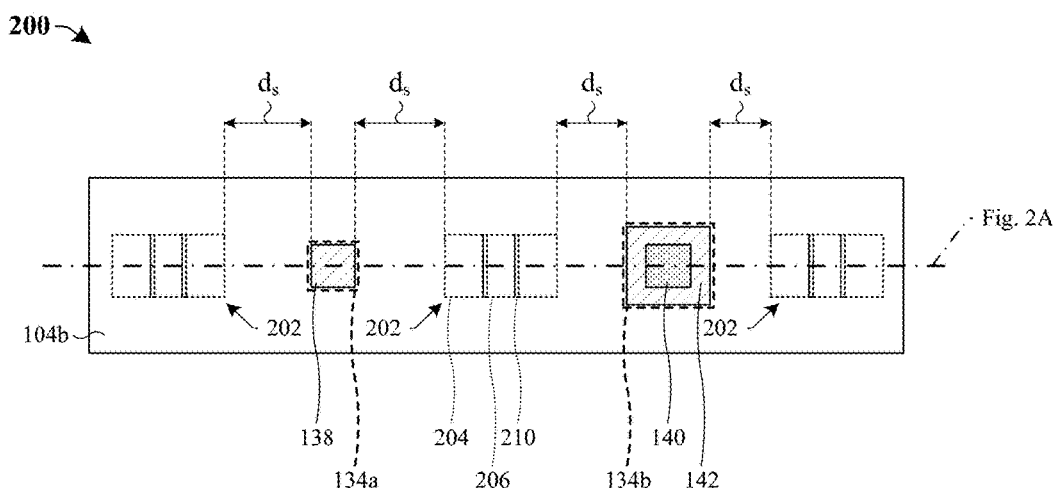
FIG. 2B illustrates a top view of some embodiments of the 3D IC of FIG. 2A according to the cut-line in FIG. 2A.

With reference to FIG. 2B, a top view of some embodiments of the 3D IC 200 of FIG. 2A according to the cut-lines in FIGS. 2A and 2B is provided.

As illustrated in FIG. 2B, the first and second TSVs 134a, 134b are laterally spaced from adjacent semiconductor devices 202 by a first lateral distance $d_s$. In some embodiments, the first lateral distance $d_s$ is approximately 60 nanometers or greater. In some embodiments, if the first lateral distance $d_s$ is less than approximately 60 nanometers, then the first and second TSVs 134a, 134b and the adjacent semiconductor devices 202 may become electrically shorted together, rendering the 3D IC 200 inoperable. In further embodiments, if the first and second isolation structures (136, 144 of FIG. 2A) are configured as DTI structures, then electrical isolation between the first and second TSVs 134a, 134b and the adjacent semiconductor devices 202 may be enhanced, thereby reducing a possibility of rendering the 3D IC 200 inoperable.

Figure 3A:
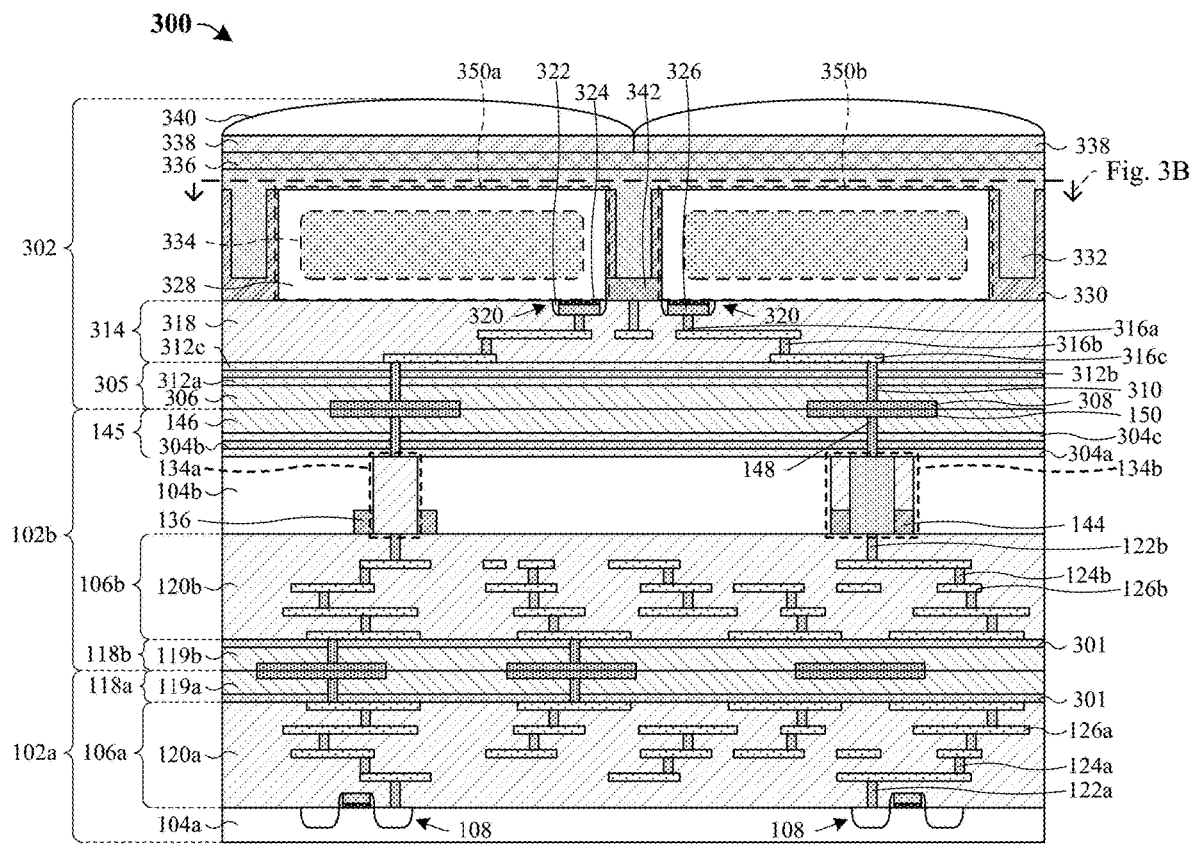
FIG. 3A illustrates a cross-sectional view of some embodiments of a pixel sensor device comprising a pixel sensor IC die and further comprising a 3D IC die underlying the pixel sensor IC die, where the 3D IC die comprises a first IC die and a second IC die that respectively comprise first semiconductor devices and ion TSVs.

With reference to FIG. 3A, a cross-sectional view of some embodiments of a pixel sensor device 300 including a pixel sensor IC die 302 overlying various embodiments of the 3D IC 100 of FIG. 1A.

As illustrated in FIG. 3A, the first and second IC dies 102a, 102b comprise bonding etch stop layers 301 disposed between the first and second bonding structures 118a, 118b and the first and second interconnect structures 106a, 106b, respectively. In some embodiments, the bonding etch stop layers 301 may, for example, be or comprise silicon nitride, silicon carbide, or the like. The first back-side bonding structure 145 further comprises passivation layers 304a-c. In some embodiments, a first passivation layer 304a and a third passivation layer 304c may, for example, be or comprise an oxide, silicon dioxide, or the like. In further embodiments, a second passivation layer 304b may, for example, be or comprise silicon nitride, or the like. The pixel sensor IC die 302 overlies and is bonded (e.g., a hybrid bond) to the second IC die 102b.

The pixel sensor IC die 302 comprises a second back-side bonding structure 305, a third interconnect structure 314, a third semiconductor substrate 328, and a plurality of photodetectors 350a, 350b. In some embodiments, the second back-side bonding structure 305 comprises passivation layers 312a-c, a second back-side bonding dielectric structure 306, second back-side redistribution wires 308, and second back-side redistribution vias 310. The second back-side redistribution wires 308 directly overlie and contact the back-side redistribution wires 150. Second back-side redistribution vias 310 overlie the second back-side redistribution wires 308 and extend through the second back-side bonding dielectric structure 306 and the passivation layers 312a-c. In some embodiments, a first passivation layer 312a and a third passivation layer 312c may, for example, be or comprise an oxide, silicon dioxide, or the like. In further embodiments, a second passivation layer 312b may, for example, be or comprise silicon nitride, or the like.

A third interconnect structure 314 of the pixel sensor IC die 302 comprises a third interconnect dielectric structure 318, third conductive contacts 316a, third conductive vias 316b, and third conductive wires 316c. In some embodiments, the third interconnect dielectric structure 318 may comprise a plurality of inter-layer dielectric (ILD) and/or a plurality of inter-metal dielectric (IMD) layers. The third interconnect dielectric structure 318 may, for example, be or comprise silicon dioxide, a low κ dielectric, some other dielectric, or a combination of the foregoing. The third conductive wires 316c are alternatingly stacked with the third conductive vias 316b in the third interconnect dielectric structure 318.

The plurality of photodetectors 350a, 350b is disposed within the third semiconductor substrate 328. In some embodiments, the third semiconductor substrate 328 may, for example, be a bulk substrate of monocrystalline silicon or some other semiconductor, some other type of semiconductor substrate, or a combination of the foregoing. The third semiconductor substrate 328 comprises the first doping type (e.g., P-type). The photodetectors 350a, 350b are configured to convert electromagnetic radiation (e.g., photons) into electric signals (i.e., to generate electron-hole pairs from the electromagnetic radiation). The photodetectors 350a, 350b respectively comprise photodetector collector regions 334. The photodetector collector regions 334 are regions of the third semiconductor substrate 328 having the second doping type (e.g., N-type). A floating diffusion node 342 is disposed within the third semiconductor substrate 328 between the photodetectors 350a, 350b. The floating diffusion node 342 is a region of the third semiconductor substrate 328 having the second doping type (e.g., N-type).

A plurality of transfer transistors 320 directly underlie the third semiconductor substrate 328. The transfer transistors 320 are disposed between the floating diffusion node 342 and a center of the photodetectors 350a, 350b. The plurality of transfer transistors 320 may, for example, be metal-oxide-semiconductor field-effect transistors (MOSFETs), some other metal-oxide-semiconductor (MOS) devices, some other insulated-gate field-effect transistors (IGFETs), some other semiconductor devices, or any combination of the foregoing. The transfer transistors 320 may selectively form a conductive channel between the photodetectors 350a, 350b and the floating diffusion node 342 to transfer accumulated charge (e.g., via absorbing incident radiation) in the photodetectors 350a, 350b to the floating diffusion node 342. In some embodiments, the transfer transistors 320 comprise corresponding transfer gate dielectric layer 324, corresponding transfer gate electrode 326, and corresponding transfer sidewall spacers 322. In some embodiments, the transfer transistors 320 are electrically coupled to the semiconductor devices 108 by way of the first, second, and third interconnect structures 106a, 106b, 314 and the first and second TSVs 134a, 134b. The semiconductor substrate material (e.g., silicon) of the first and second TSVs 134a, 134b mitigates mechanical strain on the transfer transistors 320, the semiconductor devices 108, and the photodetectors 350a, 350b. Thus, the first and second TSVs 134a, 134b may be vertically spaced between the transfer transistors 320, the semiconductor devices 108, and the photodetectors 350a, 350b.

Back-side isolation structures 330, 332 are disposed over and between the photodetectors 350a, 350b. An anti-reflection layer 336 directly overlies the back-side isolation structure 332. The anti-reflection layer 336 is configured to mitigate reflection of electromagnetic radiation off of the back-side isolation structures 330, 332 and the third semiconductor substrate 328. A plurality of color filters 338 (e.g., a red color filer, a blue color filter, a green color filer, etc.) directly contacts or is otherwise on the anti-reflection layer 336. The color filters 338 are respectively configured to transmit specific wavelengths of electromagnetic radiation. Further, a plurality of micro-lenses 340 is disposed over the color filters 338. The micro-lenses 340 are configured to focus electromagnetic radiation (e.g., photons) towards the photodetectors 350a, 350b.

Although the pixel sensor device 300 of FIG. 3A is illustrated with the first and second TSVs 134a, 134b of FIG. 1A, it may be appreciated, for example, that the first and second TSVs 134a, 134b from FIGS. 1C-1E may be used in FIG. 3A. Additionally, any combination of the first and second TSVs 134a, 134b from FIGS. 1A-1E may be used in FIG. 3A. Further, the first and second isolation structures 136, 144 of FIG. 3A may be configured, for example, as DTI structures as illustrated in FIG. 1E.

Figure 3B:
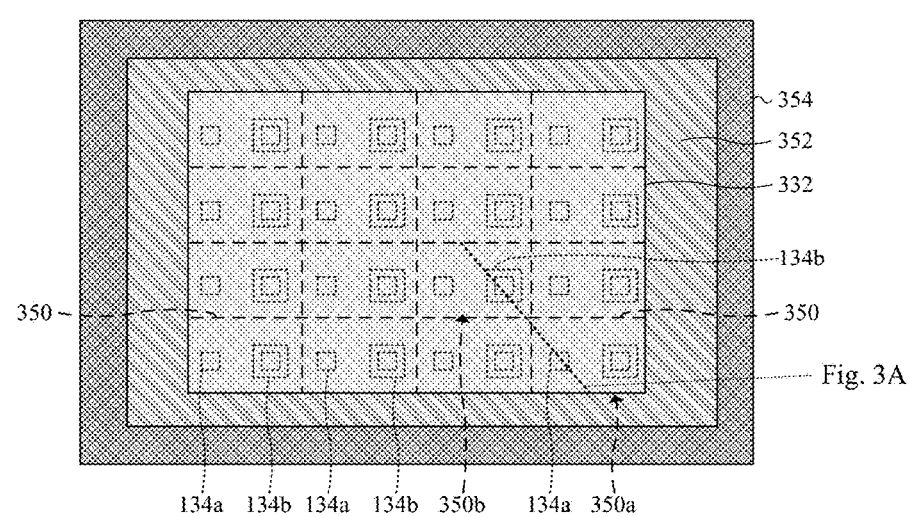
FIG. 3B illustrates a top view of some embodiments of the pixel sensor device of FIG. 3A according to the cut-line in FIG. 3A.

With reference to FIG. 3B, a top view of some embodiments of the pixel sensor device 300 of FIG. 3A according to the cut-lines in FIGS. 3A and 3B is provided.

As illustrated in FIG. 3B, a plurality of pixel cells 350 is arranged in an array comprising a plurality of rows (e.g., along an x-axis) and columns (e.g., along a y-axis) of similar pixel sensors. The plurality of pixel cells 350 is surrounded by an outer ring structure 352. The outer ring structure 352 is surrounded by an edge region 354 of the pixel sensor device 300. The first and second TSVs 134a, 134b repeat directly under each pixel cell 350 in the array.

In some embodiments, the first and second TSVs 134a, 134b are confined to a "keep-out-zone" laterally spaced from the back-side isolation structure 332 (e.g., within the outer ring structure 352). This, in turn, may limit a number of pixel cells 350 and/or TSVs that may be formed on a single IC die. The "keep-out-zone" is established because the first and second TSVs 134a, 134b may cause stress on overlying, underlying, and/or adjacent semiconductor devices (e.g., transistors, photodetectors, etc.). However, because the first and second TSVs 134a, 134b comprise the semiconductor substrate material (e.g., silicon), stress on overlying, underlying, and/or adjacent semiconductor devices is mitigated. Therefore, the first and second TSVs 134a, 134b may be disposed directly beneath each pixel cell. Thus, elimination of the "keep-out-zone" increases available space on a chip (i.e., increasing the number of semiconductor devices (e.g., transistors, photodetectors, etc.) that may be disposed on the chip), facilitates chip shrinking ability, and decreases design/modeling complexity.

Figure 3C:
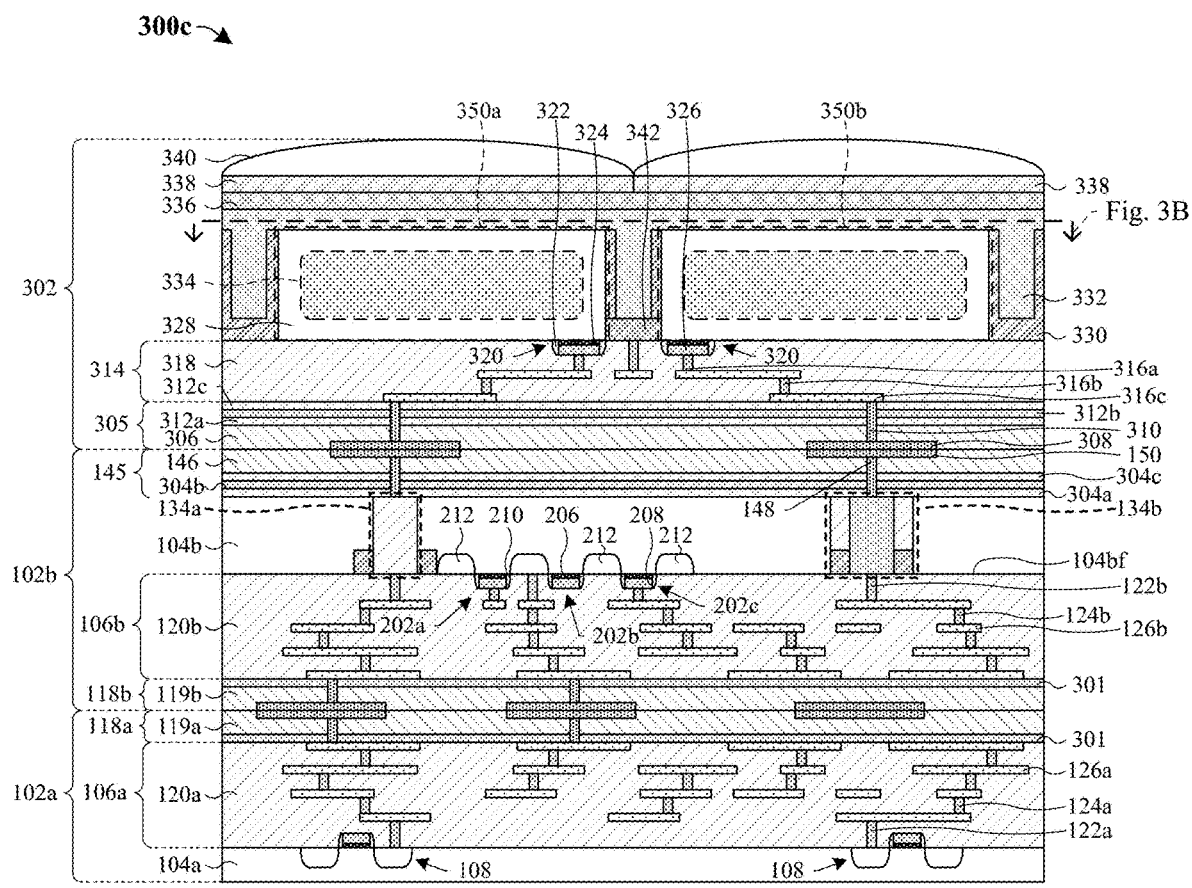
FIG. 3C illustrates a cross-sectional view of various alternative embodiments of the pixel sensor device of FIG. 3A in which the second IC die further comprises second semiconductor devices.

With reference to FIG. 3C, a cross-sectional view of a pixel sensor device 300c according to some alternative embodiments of the pixel sensor device 300 of FIG. 3A is provided in which a second plurality of semiconductor devices 202a-c is disposed on the front-side 104bf of the second semiconductor substrate 104b.

In some embodiments, the second plurality of semiconductor devices 202a-c may, for example, be transistors, varactors, diodes, resistors, etc. In further embodiments, the semiconductor devices 202a-c are configured as transistors and respectively comprise floating nodes 212, gate dielectric 206, gate electrode 208, and sidewall spacers 210. The floating nodes 212 are respectively at sides of the gate electrode 208. The floating nodes 212 have the second doping type (e.g., N-type) and directly adjoin portions of the second semiconductor substrate 104b having the first doping type (e.g., P-type). In yet further embodiments, at least one semiconductor device of the second plurality of semiconductor devices 202a-c is electrically coupled to at least one TSV of the first and second TSVs 134a, 134b by way of the second interconnect structure 106b.

In some embodiments, the second plurality of semiconductor devices 202a-c is configured to control the plurality of photodetectors 350a, 350b. For example, a reset transistor 202a, a source follower transistor 202b, and a row select transistor 202c may be electrically coupled to at least one photodetector 350a, 350b by way of the second interconnect structure 106b and/or the first and second TSVs 134a, 134b.

During operation of the pixel sensor device 300c, the transfer gate electrode 326 controls charge transfer from the photodetector collector region 334 to the floating diffusion node 342. If the charge level is sufficiently high within the floating diffusion node 342, the source follower transistor 202b is activated and charges are selectively output according to operation of the row select transistor 202c used for addressing. The reset transistor 202a can be used to reset the photodetector collector region 334 between exposure periods. In some embodiments, the photodetectors 350a, 350b within the pixel sensor IC die 302 may be implemented within an organic film layer.

FIGS. 4-12 illustrate cross-sectional views 400-1200 of some embodiments of a method of forming a pixel sensor device including a pixel sensor integrated circuit (IC) die overlying an IC die comprising through-substrate vias (TSVs) according to the present disclosure. Although the cross-sectional views 400-1200 shown in FIGS. 4-12 are described with reference to a method, it will be appreciated that the structures shown in FIGS. 4-12 are not limited to the method but rather may stand alone separate of the method. Although FIGS. 4-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 4-12 may, for example, be employed to form the pixel sensor device 300 of FIG. 3A.

Figure 4:
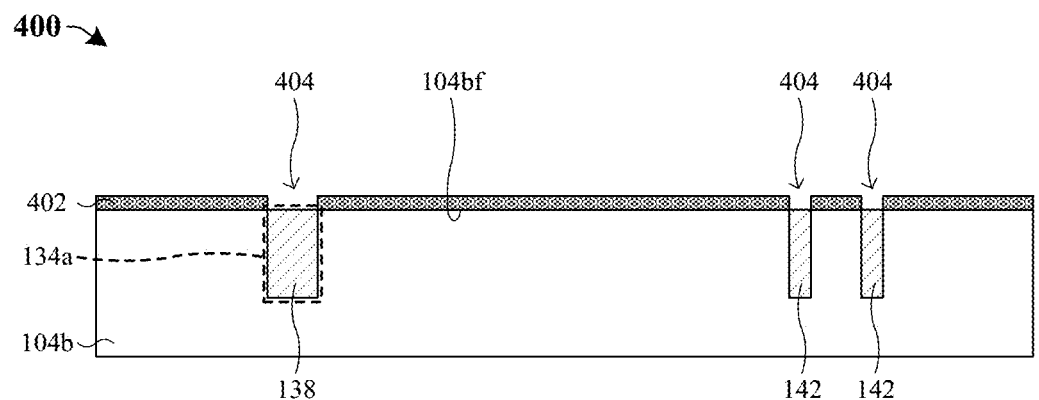
FIGS. 4-12 illustrate a series of cross-sectional views of some embodiments of a method for forming a pixel sensor device that comprises a pixel sensor IC die and a 3D IC die, where the 3D IC die underlies the pixel sensor IC die and comprises a first IC die and a second IC die that respectively comprise first semiconductor devices and ion TSVs

As shown in cross-sectional view 400 of FIG. 4, a second semiconductor substrate 104b is provided and a first masking layer 402 is formed over a front-side 104bf of the second semiconductor substrate 104b. In some embodiments, the second semiconductor substrate 104b may be, for example, a bulk substrate (e.g., a bulk silicon substrate), a silicon-on-insulator (SOI) substrate, or some other suitable substrate. In some embodiments, before forming the first masking layer 402, a first implant process is performed to dope the second semiconductor substrate 104b with a first doping type (e.g., P-type) to a doping concentration of approximately $1*10^{15}$ atoms/cm$^3$. In some embodiments, the first masking layer 402 may, for example, be or comprise an oxide, silicon dioxide, silicon nitride, or the like. In further embodiments, the first masking layer 402 may be a photoresist layer. In the aforementioned embodiment, an oxide layer may be formed between the first masking layer 402 and the second semiconductor substrate 104b (not shown). The oxide layer may, for example, be configured to prevent channeling effect and/or protect a lattice structure of the second semiconductor substrate 104b. The first masking layer 402 defines a plurality of openings 404 and has a plurality of sidewalls in the plurality of openings 404. In some embodiments, the P-type dopants of the first doping type may, for example be or comprise boron, difluoroboron (e.g., $BF_2$), indium, some other suitable P-type dopants, or any combination of the foregoing.

Further, as seen in cross-sectional view 400 of FIG. 4, a second implant process is performed to form a first doped channel region 138 and a third doped channel region 142 within the second semiconductor substrate 104b, where the first doped channel region 138 defines a first TSV 134a. In some embodiments, the first and third doped channel regions 138, 142 underlie the plurality of openings 404. In some embodiments, the first and third doped channel regions 138, 142 may have a second doping type (e.g., N-type) opposite the first doping type and may further have a doping concentration within a range of approximately $1*10^{16}$ to $1*10^{20}$ atoms/cm$^3$. After the second implant process is performed, a first removal process may be performed to remove the first masking layer 402 (not shown). In some embodiments, the first removal process may include an etch process and/or a planarization process (e.g., a chemical mechanical planarization (CMP) process). In some embodiments, the N-type dopants of the second doping type may, for example be or comprise phosphorous, arsenic, antimony, some other suitable N-type dopants, or any combination of the foregoing.

Figure 5:
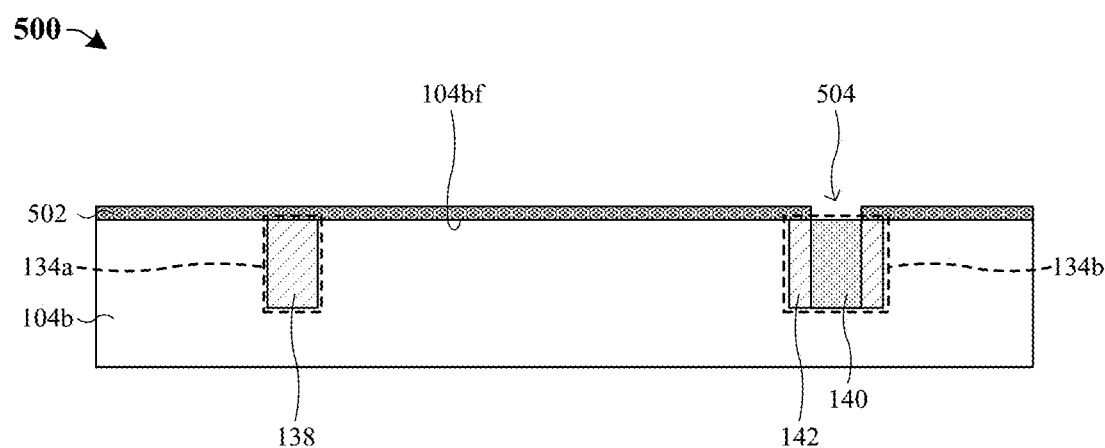

As shown in cross-sectional view 500 of FIG. 5, a second masking layer 502 is formed over the front-side 104bf of the second semiconductor substrate 104b. The second masking layer 502 defines at least one opening 504 and has a plurality of sidewalls in the at least one opening 504. In further embodiments, the second masking layer 502 may be a photoresist layer. In the aforementioned embodiment, an oxide layer may be formed between the second masking layer 502 and the second semiconductor substrate 104b (not shown). The oxide layer may, for example, be configured to prevent channeling effect and/or protect a lattice structure of the second semiconductor substrate 104b. In further embodiments, the oxide layer may remain over the second semiconductor substrate 104b for subsequent processing steps (not shown). A third implant process is performed to form a second doped channel region 140 within the second semiconductor substrate 104b, where the second and third doped channel regions 142, 140 define a second TSV 134b. In some embodiments, the second doped channel region 140 has the first doping type and a doping concentration within a range of approximately $1*10^{16}$ to $1*10^{20}$ atoms/cm$^3$. In some embodiments, a doping concentration of the second doped channel region 140 is greater than a doping concentration of the second semiconductor substrate 104b. In further embodiments, the second doped channel region 140 may be formed by a counter-doping process.

In some embodiments, after forming the first and second TSVs 134a, 134b, a rapid thermal annealing (RTA) process is performed on the second semiconductor substrate 104b, for example, to repair any damage to the second semiconductor substrate 104b from forming the first and/or second TSVs 134a, 134b. In yet further embodiments, the RTA process may reach a temperature within a range of approximately 995 to 1010 degrees Celsius. After performing the RTA process, a second removal process may be performed to remove the second masking layer 502 (not shown). In some embodiments, the second removal process may include an etch process and/or a planarization process (e.g., a chemical mechanical planarization (CMP) process).

Figure 6:
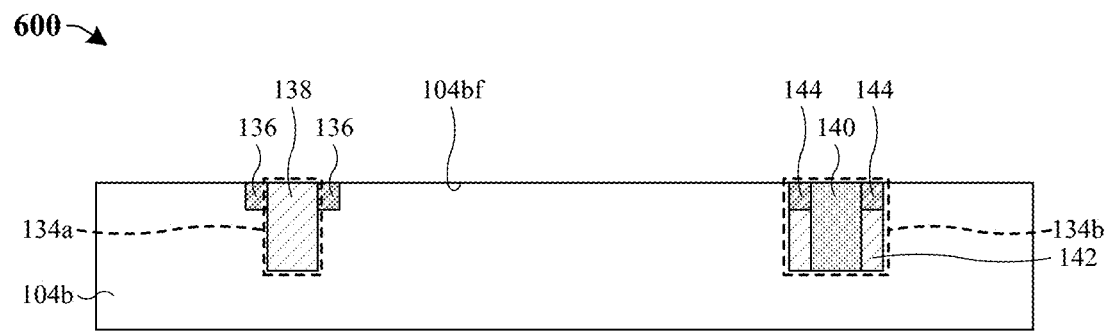

As shown in cross-sectional view 600 of FIG. 6, a first isolation structure 136 and a second isolation structure 144 are formed on the front-side 104bf of the second semiconductor substrate 104b. In some embodiments, formation of the first and second isolation structures 136, 144 may include: forming a masking layer (not shown) over the second semiconductor substrate 104b; performing an etch process according to the masking layer to define openings in the second semiconductor substrate 104b; filling the openings in the second semiconductor substrate 104b with a dielectric material; performing a removal process to remove the masking layer and/or excess dielectric material (not shown). In further embodiments, the first and second isolation structures 136, 144 may, for example, be or comprise a dielectric material, silicon dioxide, or the like.

In some embodiments, a plurality of semiconductor devices (e.g., transistors) (not shown) may be formed on the front-side 104bf of the second semiconductor substrate 104b before and/or after forming the first and/or second TSVs 134a, 134b (not shown). In further embodiments, a bottom surface of first isolation structure 136 is aligned with or below a bottom surface of the first TSV 134a and a top surface of the first isolation structure 136 is aligned with the front-side 104bf of the second semiconductor substrate 104b. In yet further embodiments, a bottom surface of the second isolation structure 144 is aligned with or below a bottom surface of the second TSV 134b and a top surface of the second isolation structure 144 is aligned with the front-side 104bf of the second semiconductor substrate 104b.

Figure 7:
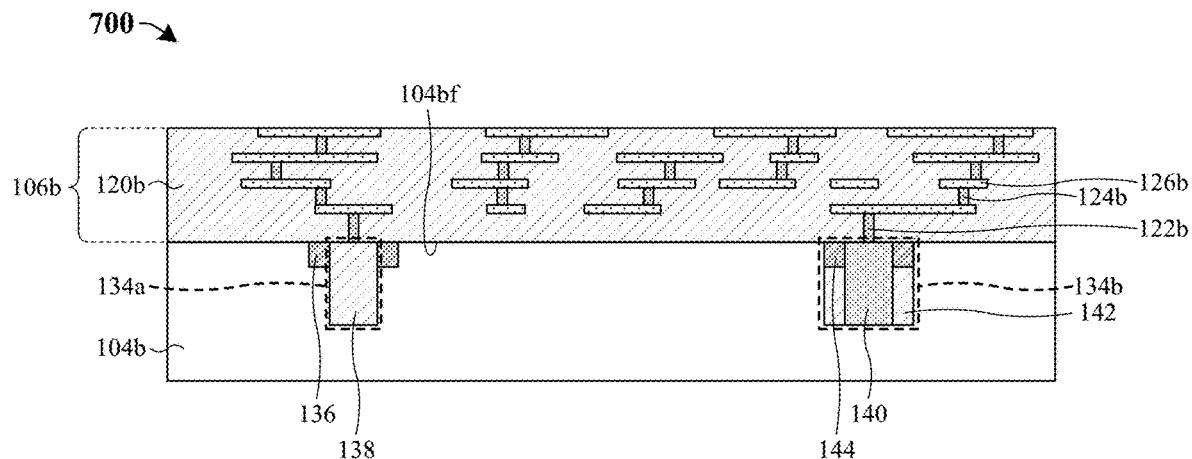

As shown in cross-sectional view 700 of FIG. 7, a second interconnect structure 106b is formed over the front-side 104bf of the second semiconductor substrate 104b. The second interconnect structure 106b comprises a second interconnect dielectric structure 120b, second conductive contacts 122b, second conductive vias 124b, and second conductive wires 126b. The second conductive vias 124b are within the second interconnect dielectric structure 120b and extend respectively from second conductive wires 126b to the first and second TSVs 134a, 134b.

In some embodiments, a process for forming the second interconnect structure 106b comprises forming the second conductive contacts 122b by a single damascene process, and subsequently forming a bottommost layer of the second conductive wires 126b by the single damascene process. Further, in some embodiments, the process comprises forming the second conductive vias 124b and remaining layers of the second conductive wires 126b by repeatedly performing a dual damascene process. In some embodiments, the single damascene process comprises depositing a dielectric layer, patterning the dielectric layer with openings for a single layer of conductive features (e.g., a layer of contacts, vias, or wires), and filling the openings with conductive materials to form the single layer of conductive features. In some embodiments, the dual damascene process comprises depositing a dielectric layer, patterning the dielectric layer with openings for two layers of conductive features (e.g., a layer of vias and a layer of wires), and filling the openings with conductive material to form the two layers of conductive features. In some embodiments, the second conductive contacts, vias, and wires 122b, 124b, 126b may, for example, be or comprise aluminum copper, copper, aluminum, or the like.

Figure 8:
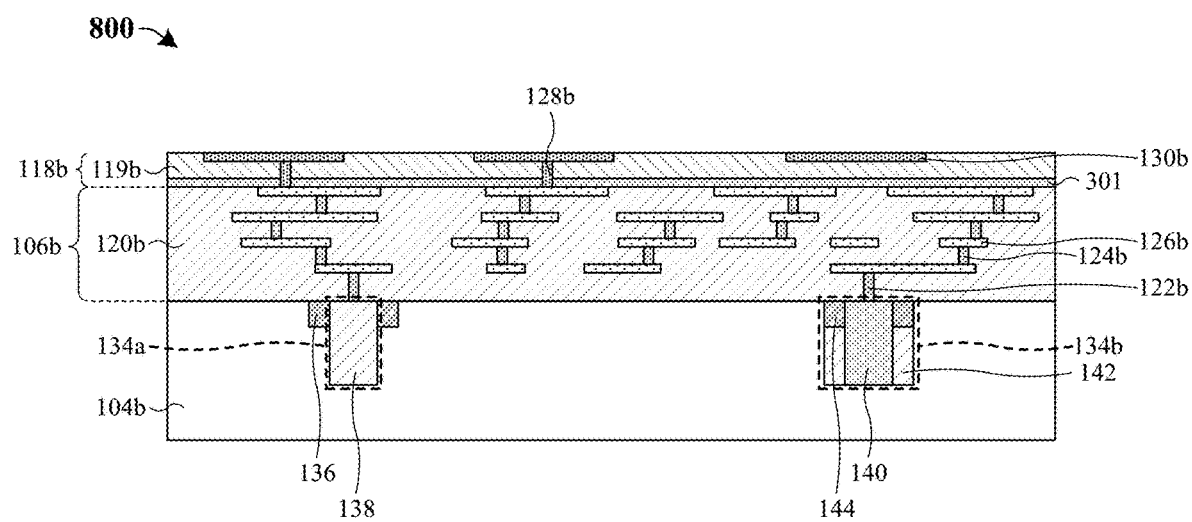

As shown in cross-sectional view 800 of FIG. 8, a second bonding structure 118b is formed over the second interconnect structure 106b. In some embodiments, the second bonding structure 118b comprises a bonding etch stop layer 301, a second bonding dielectric structure 119b, second redistribution vias 128b, and second redistribution wires 130b. The bonding etch stop layer 301 is formed over the second interconnect structure 106b and the second bonding dielectric structure 119b is formed over the bonding etch stop layer 301. Second redistribution vias 128b and second redistribution wires 130b are formed over the interconnect structure 106b such that the second redistribution vias and wires 128b, 130b are electrically coupled to conductive layers within the second interconnect structure 106b. In some embodiments, a single and/or dual damascene process may be performed to form the second redistribution vias and/or wires 128b, 130b.

Figure 9:
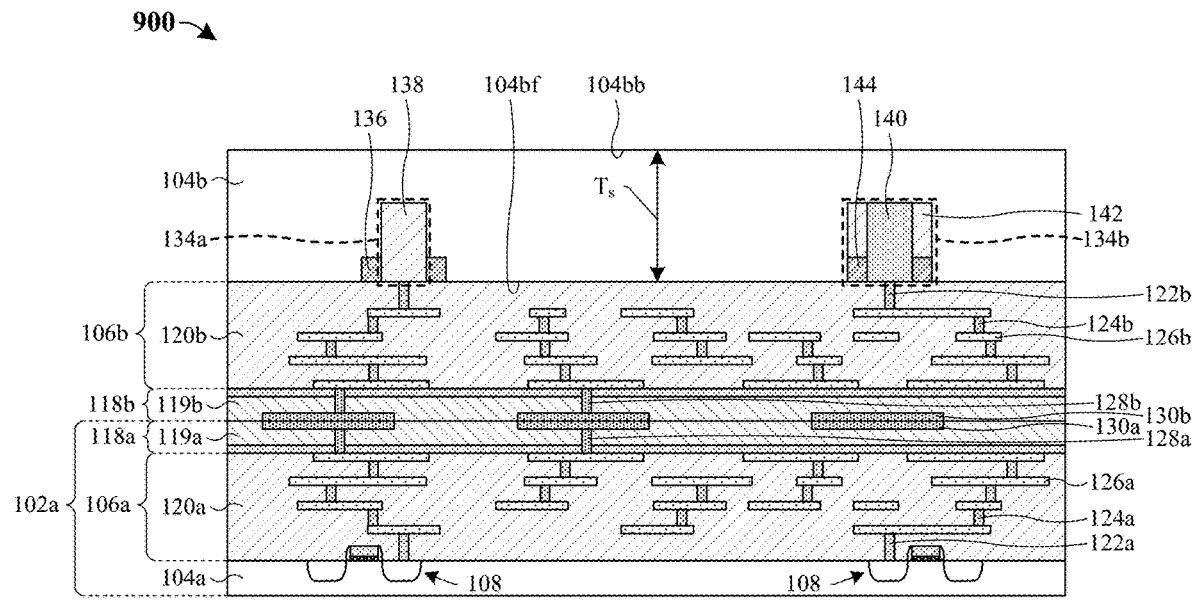

As shown in cross-sectional view 900 of FIG. 9, a first IC die 102a is provided and the structure of FIG. 8 is flipped and subsequently bonded to the first IC die 102a. The second bonding structure 118b interfaces with a first bonding structure 118a of the first IC die 102a at a hybrid bond. In some embodiments, the first IC die 102a is configured as the first IC die 102a of FIG. 1A. The hybrid bond comprises a dielectric-to-dielectric bond between the first and second bonding dielectric structures 119a, 119b. Further, the hybrid bond comprises a conductor-to-conductor bond between the first and second redistribution wires 130a, 130b. The process of bonding the first and second bonding structures 118a, 118b may comprise, for example, fusion bonding processes and/or metallic bonding processes. In some embodiments, the second semiconductor substrate 104b has a thickness $T_s$ defined between the front-side 104bf of the second semiconductor substrate 104b and a back-side 104bb of the second semiconductor substrate 104b. In some embodiments, the thickness $T_s$ is within a range of approximately 750 to 800 micrometers.

Figure 10:
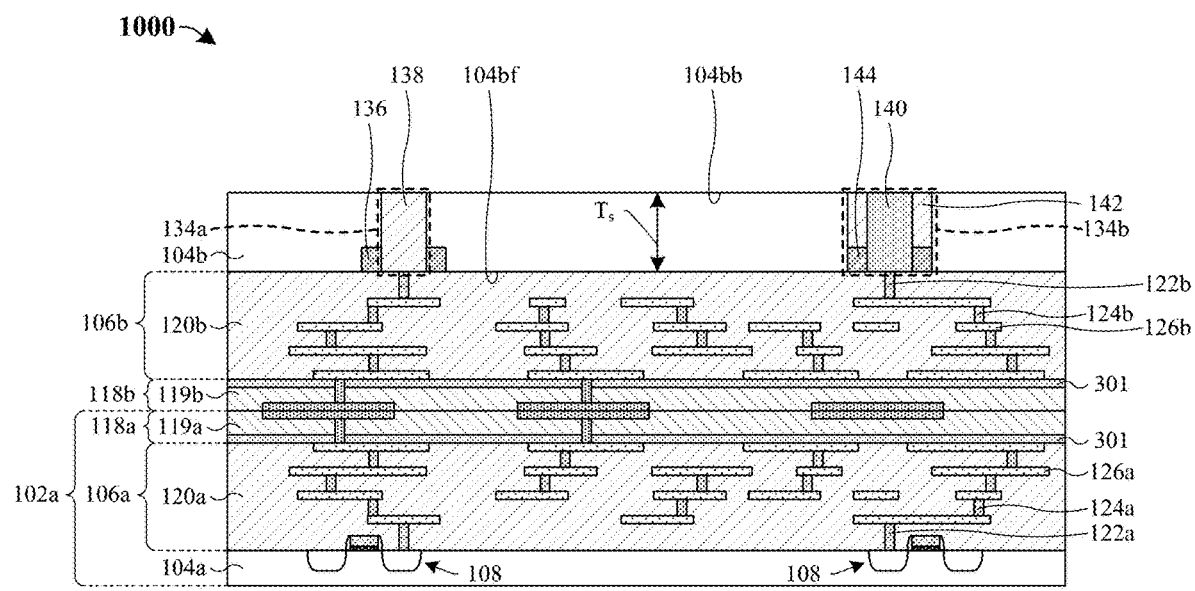

As shown in cross-sectional view 1000 of FIG. 10, a thinning process is performed on the back-side 104bb of the second semiconductor substrate 104b to expose an upper surface the first and second TSVs 134a, 134b. In some embodiments, the thinning process reduces the thickness $T_s$ of the second semiconductor substrate 104b by approximately 795 to 799 micrometers, such that the thickness $T_s$ is within a range of approximately 1 to 5 micrometers. In some embodiments, the thinning process includes a grinding process and/or an etching process.

Figure 11:
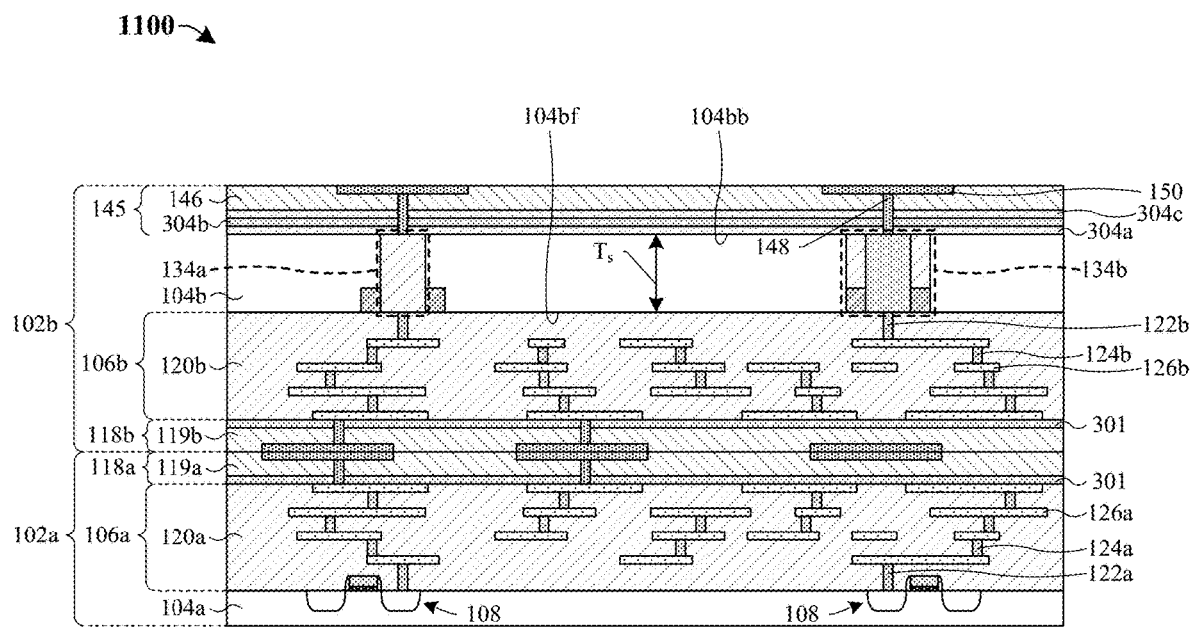

As shown in cross-sectional view 1100 of FIG. 11, a first back-side bonding structure 145 is formed over the second semiconductor substrate 104b, thereby defining a second IC die 102b. The first back-side bonding structure 145 comprises passivation layers 304a-c, a first back-side bonding dielectric structure 146, first back-side redistribution vias 148, and first back-side redistribution wires 150. The passivation layers 304a-c are formed over the second semiconductor substrate 104b. In some embodiments, a first passivation layer 304a and a third passivation layer 304c may, for example, be or comprise an oxide, silicon dioxide, or the like. In further embodiments, a second passivation layer 304b may, for example, be or comprise silicon nitride, or the like. The first back-side bonding dielectric structure 146 is formed over the passivation layers 304a-c. First back-side redistribution vias 148 and first back-side redistribution wires 150 are formed over the second semiconductor substrate 104b. The first back-side redistribution vias and wires 148, 150 are electrically coupled to conductive layers within the second interconnect structure 106b by way of the first and second TSVs 134a, 134b.

Figure 12:
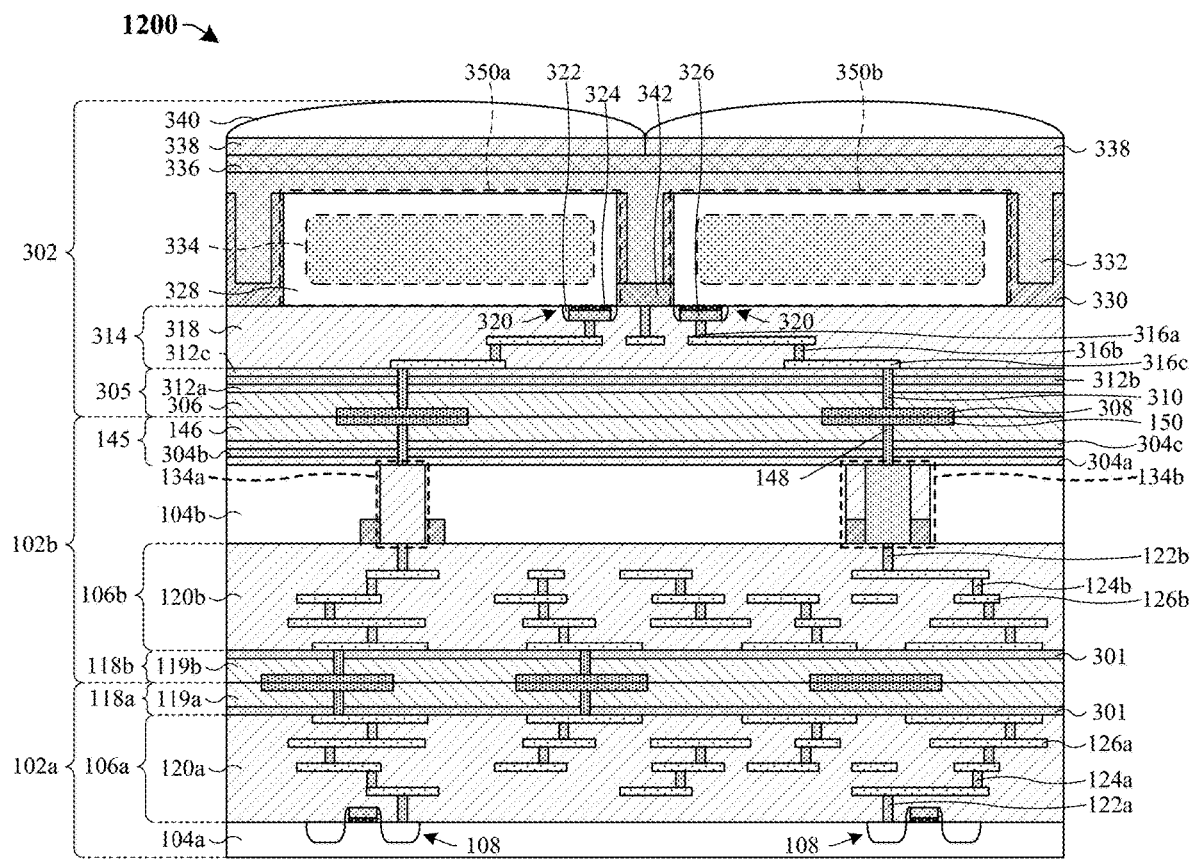

As shown in cross-sectional view 1200 of FIG. 12, a pixel sensor IC die 302 is provided and subsequently bonded to the second IC die 102b, such that the second back-side bonding structure 305 and the first back-side bonding structure 145 interface to define a hybrid bond. In some embodiments, the pixel sensor IC die 302 is configured as the pixel sensor IC die 302 of FIG. 3A. The hybrid bond comprises a dielectric-to-dielectric bond between the second back-side bonding dielectric structure 306 and the first back-side bonding dielectric structure 146. Further, the hybrid bond comprises a conductor-to-conductor bond between the first back-side redistribution wires 150 and the second back-side redistribution wires 308. The process of bonding the pixel sensor IC die 302 to the second IC die 102b may comprise, for example, fusion bonding processes and/or metallic bonding processes.

In some embodiments, it may be appreciated that the method outlined in FIGS. 4-12 may be employed, for example, to form the 3D ICs of FIGS. 1A-1E, the 3D IC 200 of FIG. 2A, and/or the pixel sensor device 300C of FIG. 3C. In some embodiments, the first and second isolation structures 136, 144 may be formed before forming the first and second TSVs 134a, 134b (such that the first and second isolation structures 136, 144 may, for example, act as masking layers for the doping process). In further embodiments, the third doped channel region 142 may be formed, for example, as a doped well and the second doped channel region 140 may be formed by a counter-doping process in a center portion of the doped well.

Figure 13:
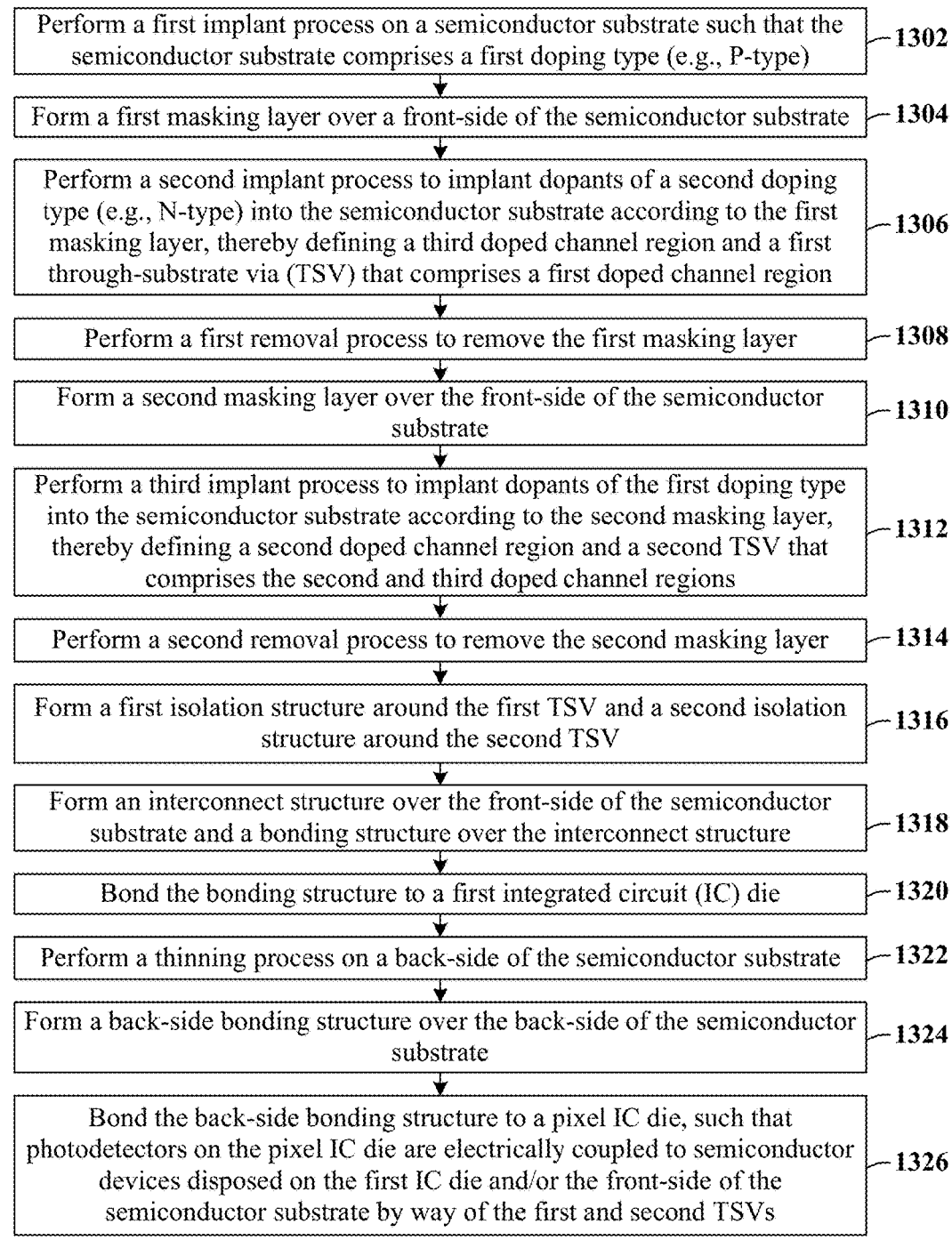
FIG. 13 illustrates a block diagram of some embodiments of the method of FIGS. 4-12.

FIG. 13 illustrates a block diagram of a method 1300 of forming a pixel sensor device in accordance with some embodiments. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a first implant process is performed on a semiconductor substrate, such that the semiconductor substrate comprises a first doping type (e.g., P-type). FIG. 4 illustrates a cross-sectional view 400 corresponding to some embodiments of act 1302.

At act 1304, a first masking layer is formed over a front-side of the semiconductor substrate. FIG. 4 illustrates the cross-sectional view 400 corresponding to some embodiments of act 1304.

At act 1306, a second implant process is performed to implant dopants of a second doping type (e.g., N-type) into the semiconductor substrate according to the first masking layer. The second implant process defines a third doped channel region and a first through-substrate via (TSV) that comprises a first doped channel region.

At act 1308, a first removal process is performed to remove the first masking layer. FIG. 4 illustrates the cross-sectional view 400 corresponding to some embodiments of act 1308.

At act 1310, a second masking layer is formed over the front-side of the semiconductor substrate. FIG. 5 illustrates a cross-sectional view 500 corresponding to some embodiments of act 1310.

At act 1312, a third implant process is performed according to the second masking layer to implant dopants of the first doping type into the semiconductor substrate. The third implant process defines a second doped channel region, thereby defining a second TSV that comprises the second and third doped channel regions. FIG. 5 illustrates the cross-sectional view 500 corresponding to some embodiments of act 1312.

At act 1314, a second removal process is performed to remove the second masking layer. FIG. 5 illustrates the cross-sectional view 500 corresponding to some embodiments of act 1314.

At act 1316, a first isolation structure is formed around the first TSV and a second isolation structure is formed around the second TSV. FIG. 6 illustrates a cross-sectional view 600 corresponding to some embodiments of act 1316.

At act 1318, an interconnect structure is formed over the front-side of the semiconductor substrate and a bonding structure is formed over the interconnect structure. FIGS. 7 and 8 illustrate cross-sectional views 700 and 800 corresponding to some embodiments of act 1318.

At act 1320, the bonding structure is bonded to a first integrated circuit (IC) die. FIG. 9 illustrates a cross-sectional view 900 corresponding to some embodiments of act 1320.

At act 1322, a thinning process is performed on a back-side of the semiconductor substrate. FIG. 10 illustrates a cross-sectional view 1000 corresponding to some embodiments of act 1322.

At act 1324, a back-side bonding structure is formed over the back-side of the semiconductor substrate. FIG. 11 illustrates a cross-sectional view 1100 corresponding to some embodiments of act 1324.

At act 1326, the back-side bonding structure is bonded to a pixel IC die. Photodetectors on the pixel IC die are electrically coupled to semiconductor devices disposed in the first IC die and/or on the front-side of the semiconductor substrate by way of the first and second TSVs. FIG. 12 illustrates a cross-sectional view 1200 corresponding to some embodiments of act 1326.

Accordingly, in some embodiments, the present disclosure relates to a method of forming through-substrate vias (TSVs) with at least one implant process in a semiconductor substrate of a second integrate circuit (IC) die. The second IC die is bonded to a first IC die and a pixel IC die such that photodetectors within the pixel IC die are laterally aligned with the TSVs. Thus, a "keep-out-zone" is not established within the semiconductor substrate of the second IC die.

In some embodiments, the present application provides an integrated circuit (IC) including a first semiconductor substrate having a front-side surface and a back-side surface respectively on opposite sides of the first semiconductor substrate, wherein the first semiconductor substrate includes a first doped channel region extending from the front-side surface to the back-side surface; a first through substrate via (TSV) defined at least by the first doped channel region; and a first interconnect structure on the front-side surface of the first semiconductor substrate, wherein the first interconnect structure includes a plurality of first conductive wires and a plurality of first conductive vias, and wherein the first conductive wires and the first conductive vias define a conductive path to the first TSV.

In some embodiments, the present application provides an integrated circuit (IC) including a first IC die including a first semiconductor substrate and a first interconnect structure overlying the first semiconductor substrate; a second IC die over the first IC die, wherein the second IC die includes a second semiconductor substrate and a second interconnect structure underlying the second semiconductor substrate, and wherein the first and second IC dies contact at a bond interface between the first and second interconnect structures; a plurality of semiconductor devices on the first semiconductor substrate and/or the second semiconductor substrate; and a first through-substrate via (TSV) and a second TSV within the second semiconductor substrate and electrically coupled to the first interconnect structure through the second interconnect structure, and wherein the first and second TSVs and the second semiconductor substrate are comprised of a semiconductor material.

In some embodiments, the present application provides a method for forming an integrated circuit (IC), the method including performing an ion implant process into a front-side surface of a first semiconductor substrate to form a first doped channel region, the first doped channel region extends from the front-side surface to a position in the first semiconductor substrate; forming a first interconnect structure over the front-side surface of the first semiconductor substrate; performing a thinning process on a back-side surface of the first semiconductor substrate, the back-side surface of the first semiconductor substrate is opposite the front-side surface of the first semiconductor substrate, wherein the thinning process removes a material of the first semiconductor substrate between the back-side surface of the first semiconductor substrate and the position in the first semiconductor substrate; and forming a conductive pad overlying and electrically coupled to the first doped channel region on the back-side surface of the first semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
    a first semiconductor substrate having a front-side surface and a back-side surface respectively on opposite sides of the first semiconductor substrate, wherein the first semiconductor substrate comprises a first doped channel region extending from the front-side surface to the back-side surface;
    a first through substrate via (TSV) defined at least by the first doped channel region; and
    a first interconnect structure on the front-side surface of the first semiconductor substrate, wherein the first interconnect structure comprises a plurality of first conductive wires and a plurality of first conductive vias, and wherein the first conductive wires and the first conductive vias define a conductive path to the first TSV.

2. The IC of claim 1, wherein the first semiconductor substrate comprises a second doped channel region and a third doped channel region respectively extending from the front-side surface to the back-side surface, wherein the second doped channel region is surrounded by the third doped channel region, and wherein the IC further comprises:
    a second TSV defined at least by the second and third doped channel regions, wherein the first and third doped channel regions comprise a first doping type and the second doped channel region comprises a second doping type opposite the first doping type.

3. The IC of claim 2, wherein the first TSV and the second TSV are comprised of silicon and the first conductive wires and vias are comprised of copper or aluminum.

4. The IC of claim 2, further comprising:
    a first isolation structure extending into the front-side surface of the first semiconductor substrate, wherein an outer sidewall of the first doped channel region adjoins an inner sidewall of the first isolation structure; and
    a second isolation structure extending into the front-side surface of the first semiconductor substrate to an isolation-structure surface facing the back-side surface of the first semiconductor substrate, wherein an outer sidewall of the second doped channel region adjoins an inner sidewall of the second isolation structure, and wherein the isolation-structure surface adjoins the third doped channel region.

5. The IC of claim 1, wherein the first semiconductor substrate, the first interconnect structure, and the first TSV partially define a first IC die, and wherein the IC further comprises:
    a second IC die underlying and bonded to the first IC die, wherein the second IC die comprises a second semiconductor substrate, a semiconductor device, and a second interconnect structure, wherein the semiconductor device overlies and is on the second semiconductor substrate, between the second semiconductor substrate and the second interconnect structure, and wherein the first TSV is electrically coupled to the semiconductor device through the first and second interconnect structures.

6. The IC of claim 5, further comprising:
    a third IC die overlying and bonded to the first IC die, wherein the third IC die comprises a third semiconductor substrate, a photodetector, and a third interconnect structure, wherein the photodetector is in the third semiconductor substrate and overlies the first TSV, wherein the third interconnect structure is between the third semiconductor substrate and the first IC die, and wherein the photodetector is electrically coupled to the semiconductor device through the first TSV and the first, second, and third interconnect structures.

7. The IC of claim 6, wherein the first, second, and third interconnect structure each comprise an alternating stack of wires and vias, wherein the wires and the vias are comprised of metal, and wherein the first TSV is comprised of silicon.

8. The IC of claim 6, wherein the first TSV overlies the semiconductor device.

9. An integrated circuit (IC) comprising:
    a first IC die comprising a first semiconductor substrate and a first interconnect structure overlying the first semiconductor substrate;
    a second IC die over the first IC die, wherein the second IC die comprises a second semiconductor substrate and a second interconnect structure underlying the second semiconductor substrate, and wherein the first and second IC dies contact at a bond interface between the first and second interconnect structures;
    a plurality of semiconductor devices on the first semiconductor substrate and/or the second semiconductor substrate; and
    a first through-substrate via (TSV) and a second TSV within the second semiconductor substrate and electrically coupled to the first interconnect structure through the second interconnect structure, and wherein the first TSV, the second TSV, and the second semiconductor substrate are respectively comprised of a same semiconductor material.

10. The IC according to claim 9, wherein the first and second interconnect structures are comprised of a conductive material different than the same semiconductor material.

11. The IC according to claim 10, wherein the same semiconductor material comprises silicon and the conductive material comprises copper.

12. The IC according to claim 9, wherein a maximum width of the first TSV is less than a minimum width of the second TSV.

13. The IC according to claim 9, wherein the second semiconductor substrate comprises a first doping type, wherein the first TSV comprises a second doping type opposite the first doping type, wherein the second TSV comprises an inner region surrounded by an outer region, and wherein the inner region comprises the first doping type and the outer region comprises the second doping type.

14. The IC according to claim 13, wherein the inner region comprises a higher doping concentration of the first doping type than the second semiconductor substrate.

15. The IC according to claim 9, further comprising:
- a first isolation structure extending from a front-side surface of the second semiconductor substrate to a position in the second semiconductor substrate, wherein an outer sidewall of the first TSV adjoins an inner sidewall of the first isolation structure; and
- a second isolation structure extending from the front-side surface of the second semiconductor substrate to an isolation-structure surface of the second isolation structure, wherein the isolation-structure surface is at the position and adjoins the second TSV.

16. A method for forming an integrated circuit (IC), the method comprising:
- performing an ion implant process into a front-side surface of a first semiconductor substrate to form a first doped channel region extending into the first semiconductor substrate from the front-side surface;
- forming a first interconnect structure on the front-side surface of the first semiconductor substrate;
- thinning the first semiconductor substrate from a back-side surface of the first semiconductor substrate until the first doped channel region is exposed, wherein the back-side surface is opposite the front-side surface of the first semiconductor substrate; and
- forming a conductive pad overlying and electrically coupled to the first doped channel region on the back-side surface of the first semiconductor substrate.

17. The method according to claim 16, further comprising:
- forming an isolation structure around the first doped channel region.

18. The method according to claim 16, wherein the ion implant process further comprises:
- forming a second doped channel region in the first semiconductor substrate and laterally offset from the first doped channel region, wherein the first and second doped channel regions comprise a first doping type;
- forming a third doped channel region in the first semiconductor substrate, wherein the third doped channel region comprises a second doping type opposite the first doping type and an outer sidewall of the third doped channel region adjoins an inner sidewall of the second doped channel region; and
- performing a rapid thermal anneal (RTA) process.

19. The method according to claim 18, wherein the first doping type is n-type and the second doping type is p-type, and wherein the RTA process has a maximum temperature of approximately 1010 degrees Celsius.

20. The method according to claim 16, further comprising:
- bonding the first interconnect structure to a second interconnect structure of a logic IC die, wherein the logic IC die comprises a second semiconductor substrate underlying the second interconnect structure, and wherein at least one semiconductor device is disposed on the second semiconductor substrate and underlies the first doped channel region.

\* \* \* \* \*